US012684949B2

(12) United States Patent
Lee et al.

(10) Patent No.: US 12,684,949 B2
(45) Date of Patent: Jul. 14, 2026

(54) DISPLAY PANEL HAVING A PLURALITY OF SCAN DRIVERS CONNECTED TO DIFFERENT SIGNAL LINES AND ELECTRONIC APPARATUS INCLUDING THE SAME

(71) Applicant: Samsung Display Co., Ltd., Yongin-si (KR)

(72) Inventors: Seungchan Lee, Yongin-si (KR); Beomsoo Park, Yongin-si (KR); Seongjun Lee, Yongin-si (KR); Wangjo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 554 days.

(21) Appl. No.: 18/176,302

(22) Filed: Feb. 28, 2023

(65) Prior Publication Data

US 2023/0413606 A1    Dec. 21, 2023

(30) Foreign Application Priority Data

Jun. 16, 2022    (KR) ........................ 10-2022-0073782

(51) Int. Cl.
*H10K 59/12* (2023.01)
*H10K 59/121* (2023.01)
(Continued)

(52) U.S. Cl.
CPC ....... *H10K 59/1213* (2023.02); *H10K 59/131* (2023.02); *H10K 59/65* (2023.02)

(58) Field of Classification Search
CPC ... H10K 59/1213; H10K 59/131; H10K 59/65
(Continued)

(56) References Cited

U.S. PATENT DOCUMENTS

2018/0366586 A1    12/2018    Son et al.
2020/0211465 A1     7/2020    Jeong
(Continued)

FOREIGN PATENT DOCUMENTS

CN            104282259 A  *  1/2015    ............ H10D 86/40
KR    10-2018-0011397 A     2/2018
(Continued)

*Primary Examiner* — Phuc T Dang
(74) *Attorney, Agent, or Firm* — Womble Bond Dickinson (US) LLP

(57)            ABSTRACT

A display panel includes a plurality of first light-emitting diodes and a plurality of first sub-pixel circuits in a first display area, a plurality of second light-emitting diodes and a plurality of second sub-pixel circuits in a second display area, and a transmissive area between the plurality of second light-emitting diodes, wherein each of the plurality of first and second sub-pixel circuits includes a first transistor, a second transistor, and a third transistor diode-connecting a gate electrode to a drain electrode of the first transistor, and wherein a first signal line, which is electrically connected to a gate electrode of the third transistor of each of the plurality of first sub-pixel circuits, is configured to transfer a signal different from a signal of a second signal line which is electrically connected to a gate electrode of the third transistor of each of the plurality of second sub-pixel circuits.

18 Claims, 17 Drawing Sheets

(51) Int. Cl.
    *H10K 59/131*     (2023.01)
    *H10K 59/65*     (2023.01)

(58) Field of Classification Search
    USPC .......................................................... 257/40
    See application file for complete search history.

(56)            References Cited

U.S. PATENT DOCUMENTS

| | | |
|---|---|---|
| 2021/0359266 A1 | 11/2021 | Bang et al. |
| 2021/0408182 A1 | 12/2021 | Chung et al. |
| 2022/0165996 A1* | 5/2022 | Bae ...................... H10K 59/131 |

FOREIGN PATENT DOCUMENTS

| | | | |
|---|---|---|---|
| KR | 10-2019-0088159 A | 7/2019 | |
| KR | 10-2019-0102989 A | 9/2019 | |
| KR | 10-2020-0037029 A | 4/2020 | |
| KR | 10-2020-0083854 A | 7/2020 | |
| KR | 10-2021-0103632 A | 8/2021 | |
| KR | 10-2021-0142030 A | 11/2021 | |
| TW | 202013343 A * | 4/2020 | ........... H10K 59/122 |

* cited by examiner

DISPLAY PANEL HAVING A PLURALITY OF SCAN DRIVERS CONNECTED TO DIFFERENT SIGNAL LINES AND ELECTRONIC APPARATUS INCLUDING THE SAME

CROSS-REFERENCE TO RELATED APPLICATION

The present application claims priority to and the benefit of Korean Patent Application No. 10-2022-0073782, filed on Jun. 16, 2022, in the Korean Intellectual Property Office, the entire disclosure of which is incorporated herein by reference.

BACKGROUND

Aspects of one or more embodiments relate to a display panel including a transmissive area inside a display area, and an electronic apparatus including the display panel.

One or more embodiments include a display panel including a transmissive area inside a display area, and an electronic apparatus including the display panel.

SUMMARY

Aspects of one or more embodiments include a display panel including a transmissive area inside a display area, and a structure and an operation of an electronic apparatus including the display panel.

Additional aspects will be set forth in part in the description which follows and, in part, will be apparent from the description, or may be learned by practice of the presented embodiments of the disclosure.

According to one or more embodiments, a display panel includes a plurality of first light-emitting diodes arranged in a first display area, a plurality of first sub-pixel circuits arranged in the first display area and electrically connected to the plurality of first light-emitting diodes, a plurality of second light-emitting diodes arranged in a second display area at least partially surrounded by the first display area, a plurality of second sub-pixel circuits arranged in the second display area and electrically connected to the plurality of second light-emitting diodes, and a transmissive area arranged between the plurality of second light-emitting diodes, wherein each of the plurality of first sub-pixel circuits and the plurality of second sub-pixel circuits includes a first transistor, a second transistor electrically connected to the first transistor and a data line, and a third transistor diode-connecting a gate electrode to a drain electrode of the first transistor, and wherein a first signal line is configured to transfer a signal different from a signal of a second signal line, the first signal line being electrically connected to a gate electrode of the third transistor of each of the plurality of first sub-pixel circuits, and the second signal line being electrically connected to a gate electrode of the third transistor of each of the plurality of second sub-pixel circuits.

According to some embodiments, the display panel may further include a non-display area outside a display area including the first display area and the second display area, and a plurality of scan drivers and a plurality of gate drivers each arranged in the non-display area, wherein the first signal line may be electrically connected to one of the plurality of scan drivers, and the second signal line may be electrically connected to one of the plurality of scan drivers.

According to some embodiments, the display panel may further include a plurality of scan lines electrically connected to the plurality of first sub-pixel circuits, wherein each of the plurality of scan lines may be electrically connected to the second transistor of the plurality of first sub-pixel circuits, and one of the plurality of scan lines may be the second signal line.

According to some embodiments, each of the plurality of first sub-pixel circuits and the plurality of second sub-pixel circuits may further include a sixth transistor electrically connected to the first transistor, a first electrode of each of the plurality of first light-emitting diodes, and an emission control line.

According to some embodiments, the second signal line and the emission control line may be arranged on one side of the transmissive area, and a portion of the second signal line and a portion of the emission control line may be on different layers.

According to some embodiments, the second signal line and the emission control line may be arranged on one side of the transmissive area, and the emission control line may include a first portion and a second portion arranged on a same layer as the second signal line, the first portion and the second portion being apart from each other, and a third portion having two opposite ends respectively contacting the first portion and the second portion through contact holes of at least one insulating layer on the first portion and the second portion.

According to some embodiments, a third portion of the emission control line may include a same material as a material of a gate electrode of the third transistor of each of the first sub-pixel circuits.

According to some embodiments, the display panel may further include a non-display area outside a display area including the first display area and the second display area, and a data storage portion arranged in the non-display area and electrically connected to a data line of each of the plurality of second sub-pixel circuits.

According to some embodiments, the third transistor of each of the plurality of first sub-pixel circuits may include a semiconductor layer of an oxide-based semiconductor material, and the third transistor of each of the plurality of second sub-pixel circuits may include a semiconductor layer of a silicon-based semiconductor material.

According to one or more embodiments, an electronic apparatus includes a display panel including a display area and a non-display area, the display area including a first display area and a second display area at least partially surrounded by the first display area, and the non-display area being outside the display area, and a component below the second display area of the display panel, wherein the display panel includes a plurality of first light-emitting diodes arranged in the first display area, a plurality of first sub-pixel circuits arranged in the first display area and electrically connected to the plurality of first light-emitting diodes, a plurality of second light-emitting diodes arranged in the second display area, a plurality of second sub-pixel circuits arranged in the second display area and electrically connected to the plurality of second light-emitting diodes, and a transmissive area arranged between the plurality of second light-emitting diodes, wherein each of the plurality of first sub-pixel circuits and the plurality of second sub-pixel circuits includes a first transistor, a second transistor electrically connected to the first transistor and a data line, and a third transistor diode-connecting a gate electrode to a drain electrode of the first transistor, and wherein a first signal line is configured to transfer a signal different from a signal of a second signal line, the first signal line being electrically connected to a gate of the third transistor of each of the plurality of first sub-pixel circuits, and the second signal line being electrically connected to a gate of the third transistor of each of the plurality of second sub-pixel circuits.

According to some embodiments, the display panel may further include a plurality of scan drivers and a plurality of gate drivers each arranged in the non-display area, wherein the first signal line may be electrically connected to one of the plurality of gate drivers, and the second signal line may be electrically connected to one of the plurality of scan drivers.

According to some embodiments, the display panel may further include a plurality of scan lines electrically connected to the plurality of first sub-pixel circuits, wherein each of the plurality of scan lines may be electrically connected to the second transistor of the plurality of first sub-pixel circuits, and one of the plurality of scan lines may be the second signal line.

According to some embodiments, each of the plurality of first sub-pixel circuits and the plurality of second sub-pixel circuits may further include a sixth transistor electrically connected to the first transistor, a first electrode of each of the plurality of first light-emitting diodes, and an emission control line.

According to some embodiments, the second signal line and the emission control line may be arranged on one side of the transmissive area, and a portion of the second signal line and a portion of the emission control line may be on different layers.

According to some embodiments, the second signal line and the emission control line may be arranged on one side of the transmissive area, and the emission control line may include a first portion and a second portion arranged on a same layer as the second signal line, the first portion and the second portion being apart from each other, and a third portion having two opposite ends respectively contacting the first portion and the second portion through contact holes of at least one insulating layer on the first portion and the second portion.

According to some embodiments, the third portion of the emission control line may include a same material as a material of a gate electrode of the third transistor of each of the first sub-pixel circuits.

According to some embodiments, a first interval between the emission control line and the second signal line near the transmissive area, may be less than a second interval between the emission control line and the second signal line in the first display area.

According to some embodiments, the electronic apparatus may further include a data storage portion arranged in the non-display area and electrically connected to a data line of each of the plurality of second sub-pixel circuits, wherein a data line of each of the plurality of first sub-pixel circuits may not be electrically connected to the data storage portion.

According to some embodiments, the third transistor of each of the plurality of first sub-pixel circuits may include a semiconductor layer of an oxide-based semiconductor material, and the third transistor of each of the plurality of second sub-pixel circuits may include a semiconductor layer of a silicon-based semiconductor material.

According to some embodiments, the component may include a camera or a sensor.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
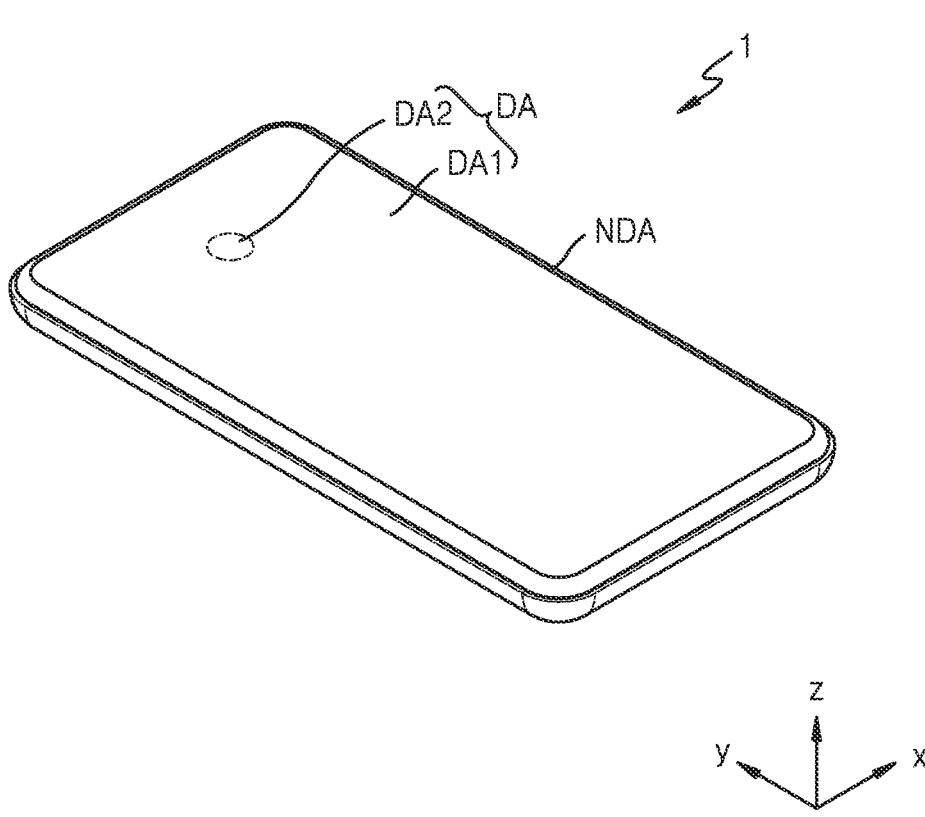
FIG. 1 is a schematic perspective view of an electronic apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, aspects of some embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the disclosure is not necessarily limited thereto.

In the case where a certain embodiment may be implemented differently, a specific process order may be performed in the order different from the described order. As an example, two processes successively described may be simultaneously performed substantially and performed in the opposite order.

It will be understood that when a layer, region, or component is referred to as being "connected" to another layer, region, or component, it may be "directly connected" to the other layer, region, or component or may be "indirectly connected" to the other layer, region, or component with other layer, region, or component located therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component located therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of an electronic apparatus 1 according to some embodiments.

According to some embodiments, the electronic apparatus 1 is an apparatus that displays moving images (e.g., video) or still images (e.g., static images), and may be used as a display screen of various products including televisions, notebook computers, monitors, advertisement boards, Internet of things (IoTs) as well as portable electronic apparatuses including mobile phones, smartphones, tablet personal computers (PCs), mobile communication terminals, electronic organizers, electronic books, portable multimedia players (PMPs), navigations, and ultra mobile personal computers (UMPCs).

In addition, the electronic apparatus 1 may be used in wearable devices including smartwatches, watchphones, glasses-type displays, and head-mounted displays (HMDs). In addition, according to some embodiments, the electronic apparatus 1 may be used as instrument panels for automobiles, center fascias for automobiles, or center information displays (CIDs) arranged on a dashboard, room mirror displays that replace side mirrors of automobiles, and displays arranged on the backside of front seats as entertainment for back seats of automobiles. For convenience of description, FIG. 1 shows the electronic apparatus 1 is used as a smartphone, but embodiments according to the present disclosure are not limited thereto.

Referring to FIG. 1, the electronic apparatus 1 may include a display area DA and a non-display area NDA outside (e.g., in a periphery of) the display area DA. The electronic apparatus 1 may be configured to display images through an array of a plurality of pixels arranged two-dimensionally (e.g., in a matrix format or arrangement) in the display area DA.

The non-display area NDA is a region that does not display images and may surround the display area DA entirely. Drivers may be arranged in the non-display area NDA, wherein the drivers are configured to provide electrical signals or power to pixels arranged in the display area DA. A pad may be arranged in the non-display area NDA, wherein the pad is a region to which a printed circuit board and the like may be electrically connected.

The display area DA may include a first display area DA1 and a second display area DA2. The second display area DA2 may be a region in which a component for adding various functions to the electronic apparatus 1 is arranged. The second display area DA2 may correspond to a component area.

Figure 2A:
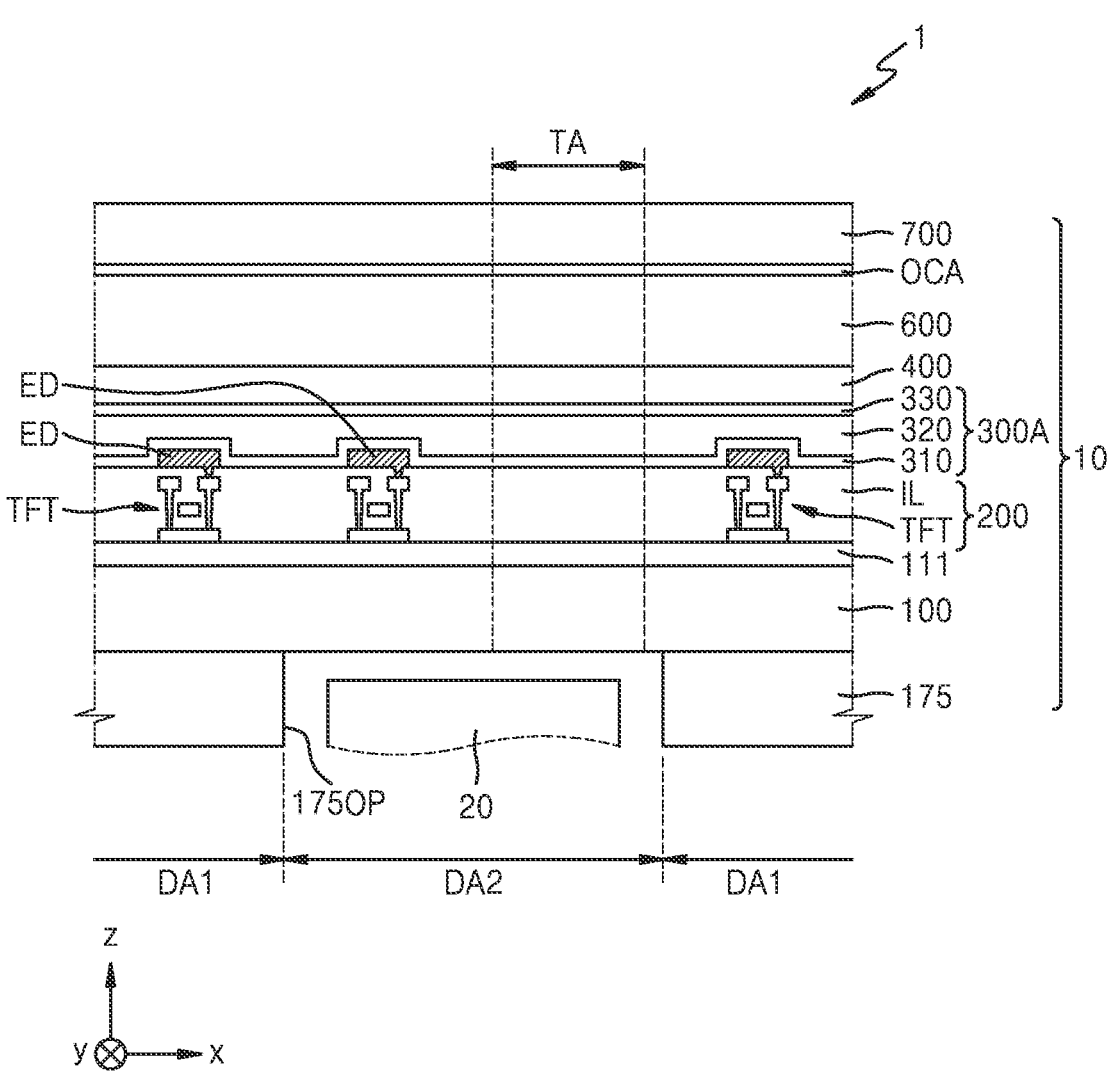
FIGS. 2A and 2B are cross-sectional views of a portion of the electronic apparatus according to some embodiments.
Figure 2B:
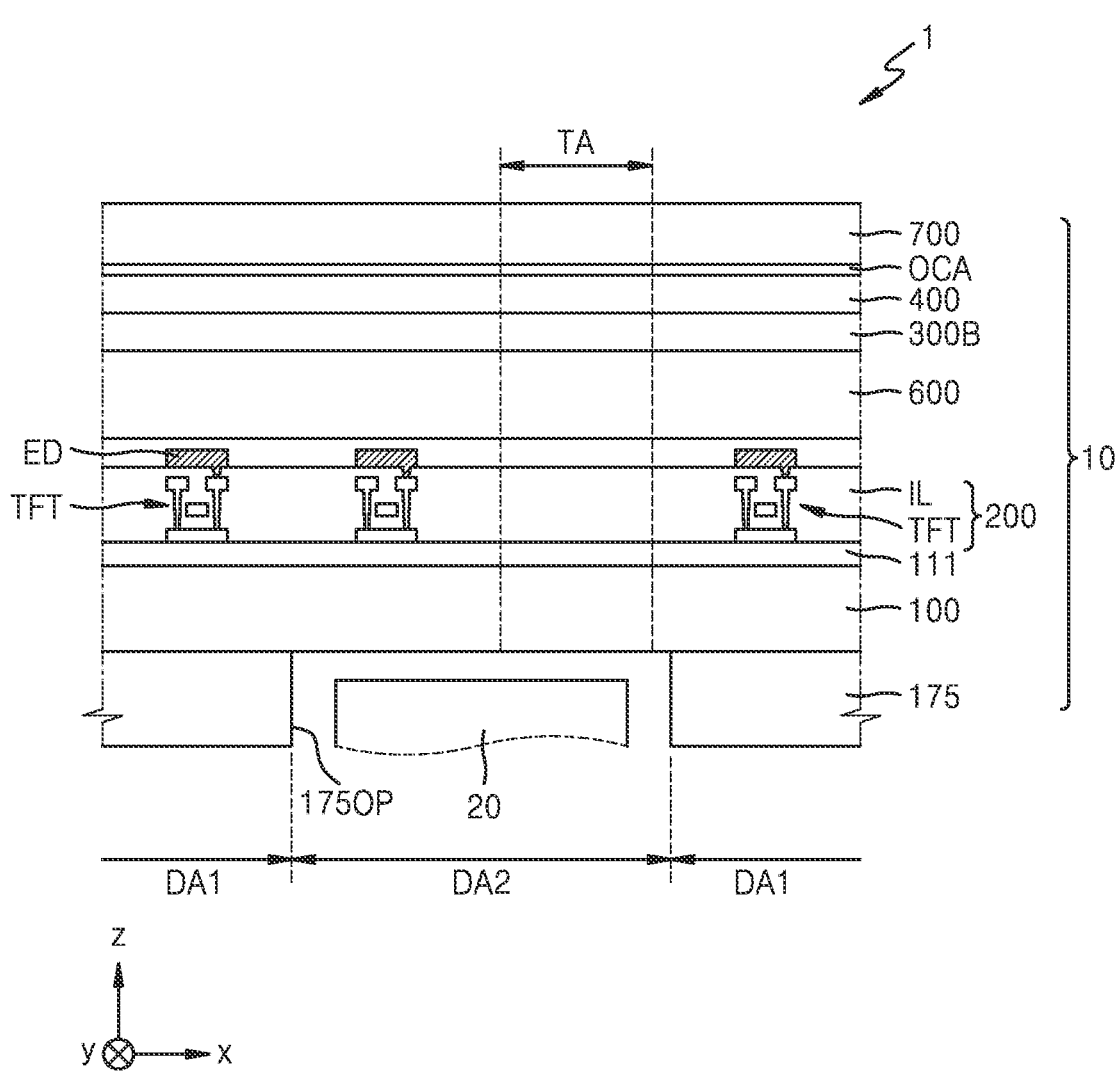

FIGS. 2A and 2B are cross-sectional views of the portion of the electronic apparatus 1 according to some embodiments.

Referring to FIGS. 2A and 2B, the electronic apparatus 1 may include a display panel 10 and a component 20 overlapping the display panel 10. The component 20 may be arranged in the second display area DA2.

The display panel 10 may include a substrate 100, a display layer 200, an encapsulation layer 300A, an input sensing layer 400, an anti-reflection layer 600, and a window 700, wherein the display layer 200 is on the substrate 100, and the encapsulation layer 300A, the input sensing layer 400, the anti-reflection layer 600, and the window 700 are on the display layer 200.

The substrate 100 may include glass or polymer resin. As an example, the substrate 100 may include the polymer resin including polyethersulfone, polyacrylate, polyetherimide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multi-layered structure including a layer that includes the polymer resin and an inorganic layer.

The display layer 200 may be located on the front surface of the substrate 100, and a lower protective film 175 may be located on the lower surface of the substrate 100. The lower protective film 175 may be attached to the lower surface of the substrate 100. An adhesive layer may be located between the lower protective film 175 and the substrate 100. Alternatively, the lower protective film 175 may be directly formed on the lower surface of the substrate 100. In such embodiments, an adhesive layer may not be located between the lower protective film 175 and the substrate 100.

The lower protective film 175 may support and protect the substrate 100. The lower protective film 175 may include an opening 1750P corresponding to the second display area DA2. The lower protective film 175 may include an organic insulating material, such as polyethylene terephthalate (PET) or polyimide (PI).

The display layer 200 may include a plurality of pixels. Each pixel may include a display element, and be configured to emit red, green, or blue light. The display element may include a light-emitting diode ED. According to some embodiments, the light-emitting diode ED may include an organic light-emitting diode including an organic emission layer. According to some embodiments, the light-emitting diode ED may be an inorganic light-emitting diode including an inorganic material. The inorganic light-emitting diode may include a PN junction diode including inorganic material semiconductor-based materials. When a forward voltage is applied to a PN-junction diode, holes and electrons are injected and energy created by recombination of the holes and the electrons is converted to light energy, and thus, light of a preset color may be emitted. The inorganic light-emitting diode may have a width in the range of several micrometers to hundreds of micrometers. According to some embodiments, the inorganic light-emitting diode may be denoted by a micro light-emitting diode. According to some embodiments, the light-emitting diode ED may be a quantum-dot light-emitting diode. An emission layer of the light-emitting diode ED may include an organic material, an inorganic material, quantum dots, an organic material and quantum dots, or an inorganic material and quantum dots.

The light-emitting diode ED may be electrically connected to a transistor TFT located therebelow. With regard to this, it is shown in FIGS. 2A and 2B that a buffer layer 111 is located on the substrate 100, the transistor TFT is located on the buffer layer 111, and the light-emitting diode ED is electrically connected to the transistor TFT through a contact hole of an insulating layer IL covering the transistor TFT.

The transistor TFT and the light-emitting diode ED electrically connected to the transistor TFT may be respectively arranged in the first display area DA1 and the second display area DA2.

The second display area DA2 may include a transmissive area TA. The transmissive area TA is a region through which light emitted from the component 20 and/or light progressing toward the component may pass. In the display panel 10, a transmittance of the transmissive area TA may be about 30% or more, about 40% or more, about 50% or more, about 60% or more, about 70% or more, about 75% or more, about 80% or more, about 85% or more, or about 90% or more.

The display layer 200 may be sealed by an encapsulation member. According to some embodiments, the encapsulation member may include the encapsulation layer 300A as shown in FIG. 2A. The encapsulation layer 300A may include at least one inorganic encapsulation layer and at least one organic encapsulation layer. According to some embodiments, the encapsulation layer 300A may include a first inorganic encapsulation layer 310, a second inorganic encapsulation layer 330, and an organic encapsulation layer 320 therebetween.

According to some embodiments, the encapsulation member may include an encapsulation substrate 300B as shown in FIG. 2B. The encapsulation substrate 300B may be arranged to face the substrate 100 with the display layer 200 therebetween. The encapsulation substrate 300B may include glass. Sealant may be located between the substrate 100 and the encapsulation substrate 300B, and arranged in the non-display area NDA described above with reference to FIG. 1. The sealant arranged in the non-display area NDA may surround the display area DA and prevent or reduce instances of moisture penetrating the lateral surface of the display panel 10.

The input sensing layer 400 may be formed on the encapsulation layer 300A or the encapsulation substrate 300B. The input sensing layer 400 may obtain coordinate information corresponding to an external input, for example, a touch event of a finger or an object such as a stylus pen. The input sensing layer 400 may include a touch electrode and touch lines connected to the touch electrode. The input sensing layer 400 may sense an external input by using a self-capacitance method and/or a mutual capacitance method.

The anti-reflection layer 600 may be formed over the encapsulation layer 300A as shown in FIG. 2A, or formed under the encapsulation substrate 300B as shown in FIG. 2B. The anti-reflection layer 600 may reduce reflectivity of light (external light) incident toward the display panel 10 from the outside. The anti-reflection layer 600 may include a filter plate including a light-blocking portion and color filters. The filter plate may include color filters, a light-blocking portion, and an overcoat layer arranged for each pixel.

The window 700 may be located over the anti-reflection layer 600 and coupled to the anti-reflection layer 600 through an adhesive layer, such as an optically clear adhesive OCA. The window 700 may include glass or plastic. The plastic may include polyethersulfone, polyacrylate, polyetherimide, polyethylene naphthalate, polyethylene terephthalate, polyphenylene sulfide, polyarylate, polyimide, polycarbonate, or cellulose acetate propionate.

The component 20 may be located in the lower portion of the display panel 10 to overlap the second display area DA2 of the display area DA. The component 20 may include a sensor, such as a proximity sensor, an illuminance sensor, an iris sensor, and a face recognition sensor, and a camera (or an image sensor). The component 20 may use light. As an example, the component 20 may be configured to emit and/or receive light in infrared, ultraviolet, and visible light bands. A proximity sensor that uses an infrared ray may detect an object arranged close to the upper surface of the electronic apparatus 1, and an illuminance sensor may detect the brightness of light incident to the upper surface of the electronic apparatus 1. In addition, an iris sensor may be configured to photograph a person's iris located over the upper surface of the electronic apparatus 1, and a camera may be configured to receive light regarding an object located on the upper surface of the electronic apparatus 1. The component 20 arranged to overlap the second display area DA2 of the display panel 10 is not limited to a proximity sensor, an illuminance sensor, an iris sensor, a face recognition sensor, and an image sensor, and various sensors may be arranged.

Figure 3A:
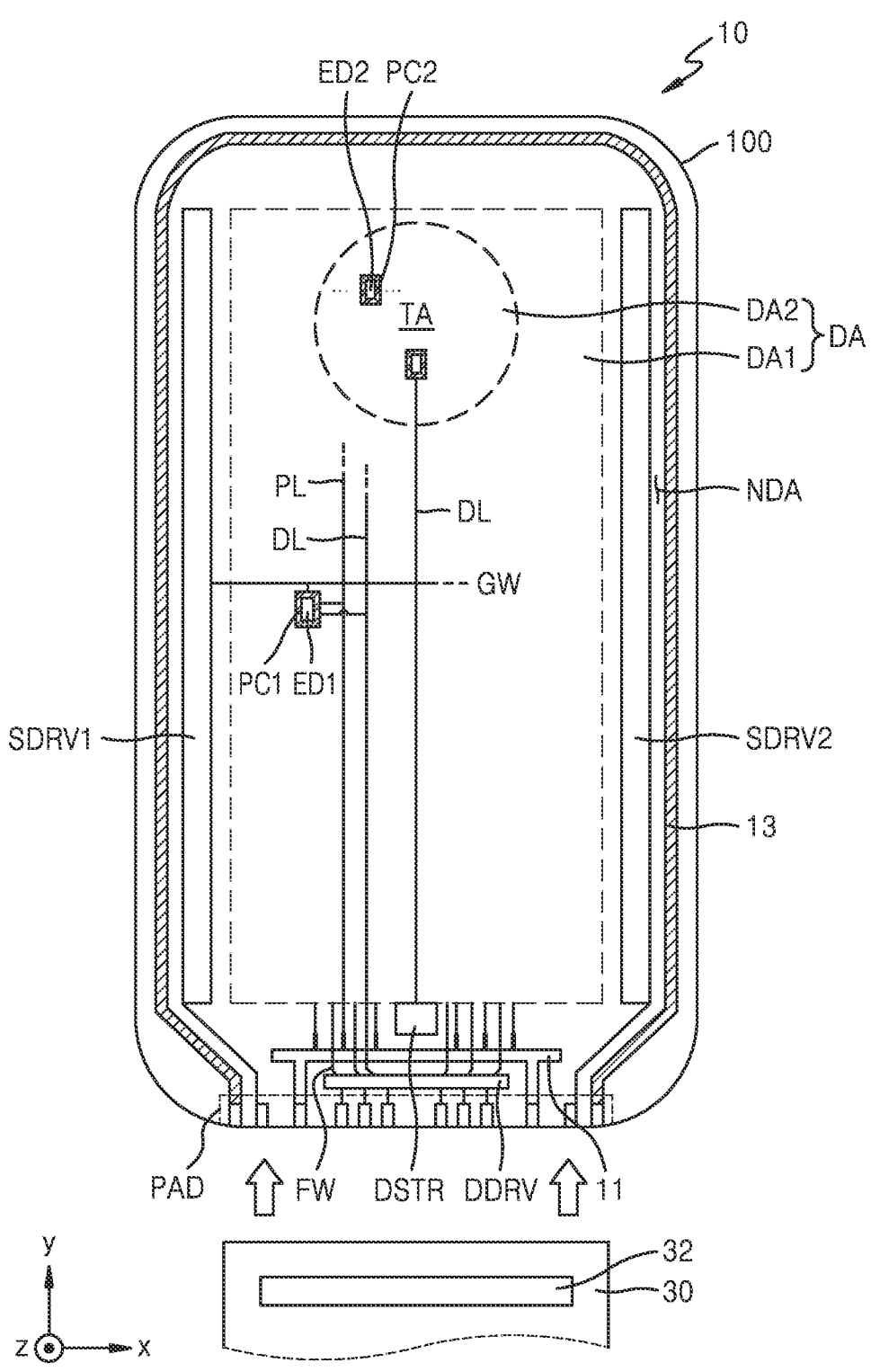
FIGS. 3A and 3B are schematic plan views of a display panel according to some embodiments.
Figure 3B:
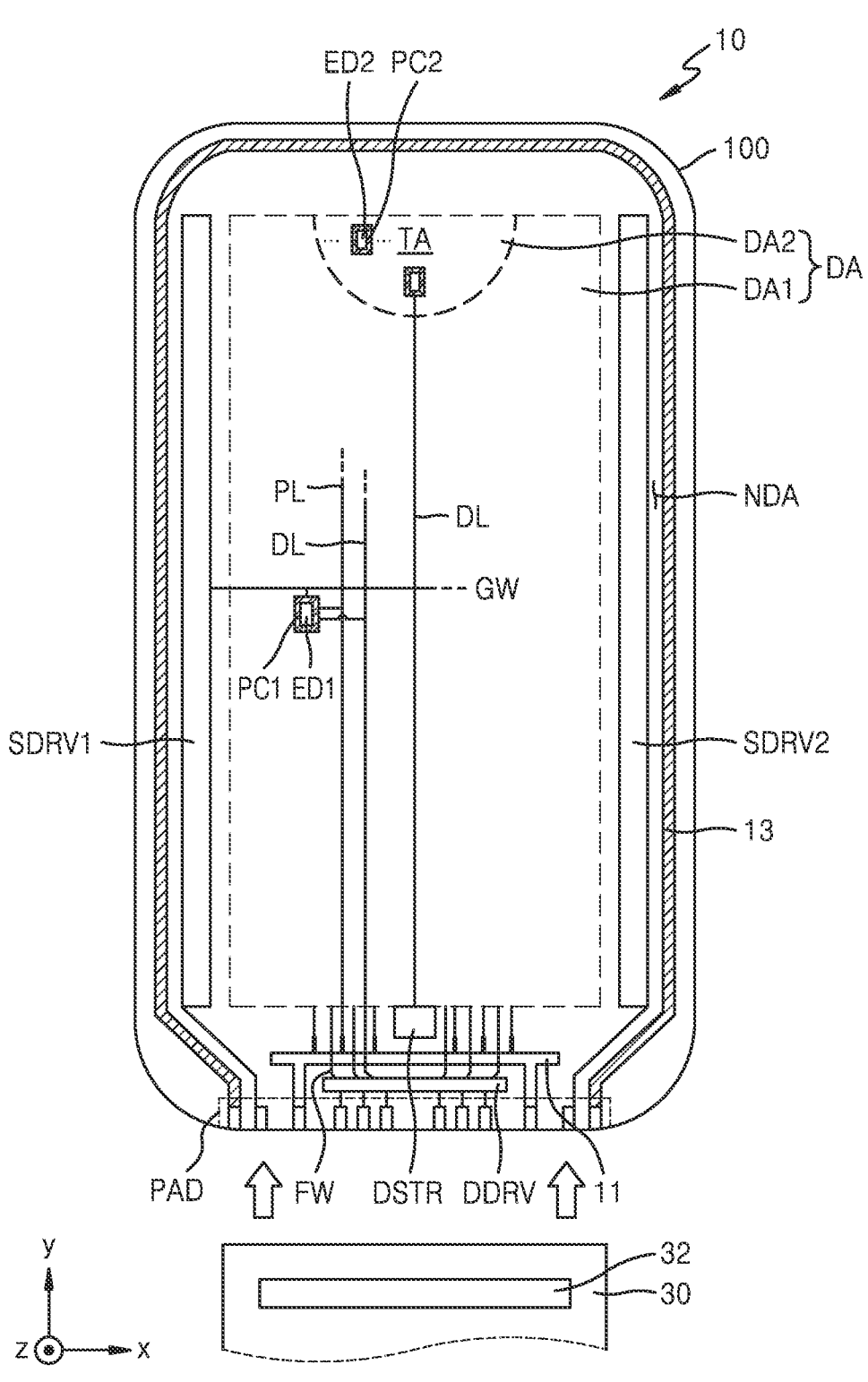

FIGS. 3A and 3B are schematic plan views of the display panel 10 according to some embodiments.

Referring to FIGS. 3A and 3B, the display panel 10 according to some embodiments may include the display area DA and the non-display area NDA. Light-emitting diodes may be arranged in the display area DA. The display area DA may correspond to an image surface of the display panel 10.

The display area DA may include the first display area DA1 and the second display area DA2, wherein the first display area DA1 occupies most of the area of the display area DA, and the second display area DA2 is at least partially surrounded by the first display area DA1 and includes the transmissive area TA. According to some embodiments, as shown in FIG. 3A, the second display area DA2 may be entirely surrounded by the first display area DA1. According to some embodiments, as shown in FIG. 3B, the second display area DA2 may be partially (e.g., only partially but not entirely) surrounded by the first display area DA1.

The light-emitting diodes arranged in the display area DA may be electrically connected to sub-pixel circuits. As an example, a first light-emitting diode ED1 arranged in the first display area DA1 may be electrically connected to a first sub-pixel circuit PC1 arranged in the first display area DA1, and a second light-emitting diode ED2 arranged in the second display area DA2 may be electrically connected to a second sub-pixel circuit PC2 arranged in the second display area DA2. The second display area DA2 may include the transmissive area TA, and the transmissive area TA may be arranged between the second light-emitting diodes ED2.

The first sub-pixel circuit PC1 is electrically connected to a scan line GW and a data line DL, wherein the scan line GW extends in a first direction (e.g., an x direction), and the data line DL extends in a second direction (e.g., a y direction). The second sub-pixel circuit PC2 may be also electrically connected to the scan line GW and the data line DL. A first driver circuitry SDRV1, a second driver circuitry SDRV2, and a data driver circuitry DDRV configured to provide signals to the first sub-pixel circuit PC1 and the second sub-pixel circuit PC2 may be arranged in the non-display area NDA.

The first driver circuitry SDRV1 may include a plurality of drivers. Some of the plurality of drivers, for example, a scan driver, may be configured to apply scan signals to the first sub-pixel circuits PC1, respectively. The second driver circuitry SDRV2 may be opposite to the first driver circuitry SDRV1 with the first display area DA1 therebetween. The second driver circuitry SDRV2 may include a plurality of drivers. Some of the first sub-pixel circuits PC1 and the second sub-pixel circuits PC2 may be electrically connected to a driver of the first driver circuitry SDRV1, and the rest may be electrically connected to a driver of the second driver circuitry SDRV2. The data driver circuitry DDRV may include a plurality of drivers (referred to as data drivers).

The data drivers may each be configured to generate a data signal. Generated data signals may be transferred to the first sub-pixel circuit PC1 and the second sub-pixel circuit PC2 through a fan-out wiring FW and the data line DL, wherein the fan-out wiring FW is arranged in the non-display area NDA of the display panel 10, and the data line DL is connected to the fan-out wiring FW. According to some embodiments, the data driver circuitry DDRV may be arranged in the non-display area NDA of the substrate 100.

A data storage portion DSTR may be arranged in the non-display area NDA. The data storage portion DSTR may be electrically connected to the data line DL electrically connected to the second sub-pixel circuit PC2. According to some embodiments, some of drivers of the data driver circuitry DDRV may be electrically connected to the data line DL configured to provide signals to the data storage portion DSTR and the second sub-pixel circuit PC2. In other words, the data line DL configured to provide signals to the second sub-pixel circuit PC2, may be configured to receive a signal (e.g., a voltage) from one of the drivers of the data driver circuitry DDRV, or receive a signal (e.g., a voltage) stored in the data storage portion DSTR.

In the case where the data line DL is configured to provide signals to the second sub-pixel circuit PC2, the display panel 10 may operate at a maximum driving frequency (referred to as a first driving frequency), and operate at a lower frequency (referred to as a second driving frequency) than the maximum driving frequency, thereby reducing power consumption. In the case where the display panel 10 operates at the first driving frequency, the data line DL configured to provide signals to the second sub-pixel circuit PC2, may be configured to receive a signal (e.g., a voltage) from one of the drivers of the data driver circuitry DDRV.

In the case where the display panel 10 operates at the second driving frequency, the data line DL configured to provide signals to the second sub-pixel circuit PC2, may be configured to receive a signal (e.g., a voltage) from one of the drivers of the data driver circuitry DDRV, and then receive a signal (e.g., a voltage) stored in the data storage portion DSTR.

A pad PAD may be arranged on one side of the substrate 100. The pad PAD may be exposed by not being covered by an insulating layer, and connected to a circuit board 30. A control driver 32 may be located on the circuit board 30.

The control driver 32 may be configured to generate control signals transferred to the first driver circuitry SDRV1 and the second driver circuitry SDRV2. Though it is shown in FIGS. 3A and 3B that the data driver circuitry DDRV is located on the substrate 100, the embodiments are not limited thereto. According to some embodiments, the control driver 32 may include a data driver circuit.

A driving voltage supply line 11 and a common voltage supply line 13 may be arranged in the non-display area NDA. The driving voltage supply line 11 may be configured to supply a driving voltage to a sub-pixel circuit, for example, each of the first and second sub-pixel circuits PC1 and PC2. The common voltage supply line 13 may be configured to apply a common voltage to the light-emitting diode, for example, the first and second light-emitting diodes ED1 and ED2.

The driving voltage supply line 11 may be arranged between the pad PAD and one side of the display area DA. The common voltage supply line 13 may have a loop shape having one open side and partially surround the display area DA in a plan view. The driving voltage supply line 11 may be electrically connected to a driving voltage line PL passing across the display area DA.

Figure 4A:
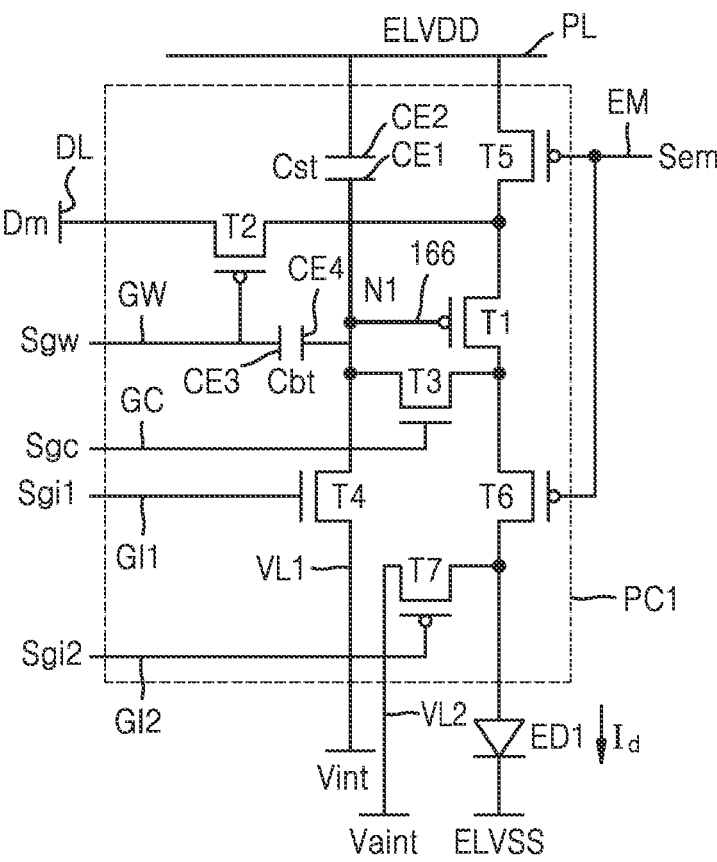
FIG. 4A is a schematic equivalent circuit diagram of a first sub-pixel circuit of a display panel and a first light-emitting diode electrically connected to the first sub-pixel circuit according to some embodiments.

FIG. 4A is a schematic equivalent circuit diagram of the first sub-pixel circuit PC1 of the display panel 10 and the first light-emitting diode ED1 electrically connected to the first sub-pixel circuit PC1 according to some embodiments.

Referring to FIG. 4A, the first light-emitting diode ED1 may be electrically connected to the first sub-pixel circuit PC1. The first sub-pixel circuit PC1 may include first to seventh transistors T1, T2, T3, T4, T5, T6, and T7, a storage capacitor Cst, and a boost capacitor Cbt.

Some of the first to seventh transistors T1, T2, T3, T4, T5, T6, and T7 may be n-channel metal oxide semiconductor (NMOS) field-effect transistors (n-channel MOSFETs), and the rest may be p-channel metal oxide semiconductor (PMOS) field-effect transistors (p-channel MOSFETs). According to some embodiments, as shown in FIG. 4A, the third and fourth transistors T3 and T4 may be n-channel MOSFETs, and the rest may be p-channel MOSFETs. As an example, the third and fourth transistors T3 and T4 may be n-channel MOSFETs including an oxide-based semiconductor material, and the rest may be p-channel MOSFETs including a silicon-based semiconductor material.

According to some embodiments, the third, fourth, and seventh transistors T3, T4, and T7 may be n-channel MOSFETs, and the rest may be p-channel MOSFETs. Alternatively, only one transistor among the first to seventh transistors T1, T2, T3, T4, T5, T6, and T7 may be an n-channel MOSFET, and the rest may be p-channel MOSFETs.

The first to seventh transistors T1, T2, T3, T4, T5, T6, and T7, the storage capacitor Cst, and the boost capacitor Cbt may be connected to signal lines. The signal lines may include an emission control line EM, a compensation gate line GC, a first initialization gate line G11, a second initialization gate line G12, and the data line DL. The first sub-pixel circuit PC1 may be electrically connected to a voltage line, for example, the driving voltage line PL, a first initialization voltage line VL1, and a second initialization voltage line VL2.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a first electrode (e.g., an anode) of the first light-emitting diode ED1 through the sixth transistor T6. One of the first electrode and the second electrode of the first transistor T1 may be a source electrode, and the other may be a drain electrode. The first transistor T1 may be configured to supply a driving current $I_d$ to the first light-emitting diode ED1 according to a switching operation of the second transistor T2.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and electrically connected to the driving voltage line PL through the fifth transistor T5. One of the first electrode and the second electrode of the second transistor T2 may be a source electrode, and the other may be a drain electrode. The second transistor T2 may be turned on according to a scan signal Sgw transferred through the scan line GW and may perform a switching operation of transferring a data signal Dm to the first electrode of the first transistor T1, wherein the data signal Dm is transferred through the data line DL.

The third transistor T3 may be a compensation transistor configured to compensate for a threshold voltage of the first transistor T1. A third gate electrode of the third transistor T3 is connected to a compensation gate line GC. A first electrode of the third transistor T3 is connected to a lower electrode CE1 of the storage capacitor Cst through a node connection line 166, and connected to the first gate electrode of the first transistor T1. A first electrode of the third transistor T3 may be connected to the fourth transistor T4. A second electrode of the third transistor T3 is connected to the second electrode of the first transistor T1 and electrically connected to the first electrode (e.g., the anode) of the first light-emitting diode ED1 through the sixth transistor T6. One of the first electrode and the second electrode of the third transistor T3 may be a source electrode, and the other may be a drain electrode.

The third transistor T3 is turned on according to a compensation signal Sgc transferred through the compensation gate line GC, and diode-connects the first transistor T1 by electrically connecting the first gate electrode to the second electrode of the first transistor T1.

The fourth transistor T4 may be a first initialization transistor configured to initialize the first gate electrode of the first transistor T1. A fourth gate electrode of the fourth transistor T4 is connected to a first initialization gate line G11. A first electrode of the fourth transistor T4 is connected to a first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to a first initialization signal Sgi1 transferred through the first initialization gate line G11 and may perform an initialization operation of initializing the voltage of the first gate electrode of the first transistor T1 by transferring the first initialization voltage Vint to the first gate electrode of the driving transistor T1.

The fifth transistor T5 may be an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the first electrode (e.g., the anode) of the first light-emitting diode ED1. One of the first electrode and the second electrode of the sixth transistor T6 may be a source electrode, and the other may be a drain electrode.

The fifth transistor T5 and the sixth transistor T6 may be simultaneously turned on according to an emission control signal Sem transferred through the emission control line EM, the driving voltage ELVDD is transferred to the first light-emitting diode ED1, and the driving current $I_d$ flows through the first light-emitting diode ED1.

The seventh transistor T7 may be a second initialization transistor configured to initialize the first electrode (e.g., the anode) of the first light-emitting diode ED1. A seventh gate electrode of the seventh transistor T7 is connected to a second initialization gate line G12. A first electrode of the seventh transistor T7 is connected to a second initialization voltage line VL2. A second electrode of the seventh transistor T7 is connected to the second electrode of the sixth transistor T6 and the first electrode (e.g., the anode) of the first light-emitting diode ED1. The seventh transistor T7 may be turned on according to a second initialization signal Sgi2 transferred through the second initialization gate line G12, and configured to initialize the first electrode of the first light-emitting diode ED1 by transferring a second initialization voltage Vaint to the first electrode (e.g., the anode) of the first light-emitting diode ED1.

According to some embodiments, the second initialization voltage line VL2 may be a next scan line. As an example, the second initialization gate line G12 connected to the seventh transistor T7 of the first sub-pixel circuit PC1 and arranged in an i-th row (i is a natural number) may correspond to a scan line of the first sub-pixel circuit PC1 arranged in an (i+1)-th row. According to some embodiments, the second initialization voltage line VL2 may be the emission control line EM. As an example, the emission control line EM may be electrically connected to the fifth to seventh transistors T5, T6, and T7.

The storage capacitor Cst includes a lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may be configured to store charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may raise the voltage of a first node N1 when a scan signal Sgw supplied to the scan line GW is turned off. When the voltage of the first node N1 is raised, a black grayscale may be clearly expressed.

The first node N1 may be a region where the first gate electrode of the first transistor T1, the first electrode of the third transistor T3, the second electrode of the fourth transistor T4, and the fourth electrode CE4 of the boost capacitor Cbt are connected to each other.

According to some embodiments, it is described with reference to FIG. 4A that the third and fourth transistors T3 and T4 are n-channel MOSFETs, and the first, second, fifth to seventh transistors T1, T2, T5, T6, and T7 are p-channel MOSFETs. The first transistor T1 directly influencing the brightness of the display apparatus may be configured to include a semiconductor layer including polycrystalline silicon having high reliability, and thus, a high-resolution display panel may be implemented through this configuration.

Figure 4B:
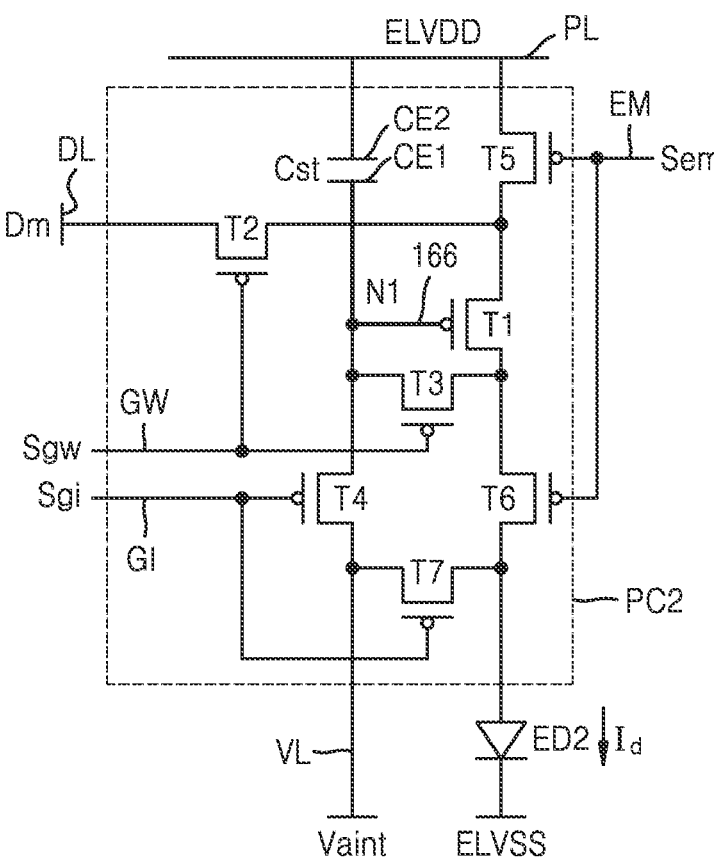
FIG. 4B is a schematic equivalent circuit diagram of a second sub-pixel circuit of a display panel and a second light-emitting diode electrically connected to the second sub-pixel circuit according to some embodiments.

FIG. 4B is a schematic equivalent circuit diagram of the second sub-pixel circuit PC2 of the display panel 10 and the second light-emitting diode ED2 electrically connected to the second sub-pixel circuit PC2 according to some embodiments.

Referring to FIG. 4B, the second light-emitting diode ED2 may be electrically connected to the second sub-pixel circuit PC2. Unlike the first sub-pixel circuit PC1 (see FIG. 4A), the second sub-pixel circuit PC2 does not include a boost capacitor Cbt. The second sub-pixel circuit PC2 may include the first to seventh transistors T1, T2, T3, T4, T5, T6, and T7, and the storage capacitor Cst.

Unlike the first sub-pixel circuit PC1 (see FIG. 4A) including an n-channel MOSFET, the second sub-pixel circuit PC2 may not include an n-channel MOSFET. The first to seventh transistors T1, T2, T3, T4, T5, T6, and T7 of the second sub-pixel circuit PC2 may be p-channel MOS-FETs.

The second sub-pixel circuit PC2 is connected to the signal lines. The number of signal lines connected to the second sub-pixel circuit PC2 is less than the number of signal lines connected to the first sub-pixel circuit PC1 (see FIG. 4A). As an example, the signal lines connected to the second sub-pixel circuit PC2 may include the scan line GW, the emission control line EM, the initialization data line GI, and the data line DL. The gate electrode of the second transistor T2 and the gate electrode of the third transistor T3 of the second sub-pixel circuit PC2 may be electrically connected to the same scan line GW. The gate electrode of the first initialization transistor T4 and the gate electrode of the second initialization transistor T7 may be electrically connected to the same line, for example, the same initialization gate line GI.

The second sub-pixel circuit PC2 is connected to the voltage lines. The number of voltage lines connected to the second sub-pixel circuit PC2 is less than the number of voltage lines connected to the first sub-pixel circuit PC1 (see FIG. 4A). The second sub-pixel circuit PC2 may be electrically connected to the driving voltage line PL and the initialization voltage line VL. The fourth transistor T4 and the seventh transistor T7 of the second sub-pixel circuit PC2 may be electrically connected to the same initialization voltage line VL.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a first electrode (e.g., an anode) of the second light-emitting diode ED2 through the sixth transistor T6. One of the first electrode and the second electrode of the first transistor T1 may be a source electrode, and the other may be a drain electrode. The first transistor T1 may be configured to supply a driving current $I_d$ to the second light-emitting diode ED2 according to a switching operation of the second transistor T2.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and electrically connected to the driving voltage line PL through the fifth transistor T5. One of the first electrode and the second electrode of the second transistor T2 may be a source electrode, and the other may be a drain electrode. The second transistor T2 may be turned on according to a scan signal Sgw transferred through the scan line GW and may perform a switching operation of transferring a data signal Dm to the first electrode of the first transistor T1, wherein the data signal Dm is transferred through the data line DL.

The third transistor T3 may be a compensation transistor configured to compensate for a threshold voltage of the first transistor T1. A signal line electrically connected to the third gate electrode of the third transistor T3 of the second sub-pixel circuit PC2 is different from the signal line electrically connected to the third gate electrode of the third transistor T3 of the first sub-pixel circuit PC1 described above with reference to FIG. 4A. In other words, a signal line electrically connected to the third gate electrode of the third transistor T3 of the second sub-pixel circuit PC2 may be configured to transfer a signal different from a signal of the signal line electrically connected to the third gate electrode of the third transistor T3 of the first sub-pixel circuit PC1 described with reference to FIG. 4A. The third gate electrode of the third transistor T3 of the second sub-pixel circuit PC2, is connected to the scan line GW.

A first electrode of the third transistor T3 is connected to the lower electrode CE1 of the storage capacitor Cst through a node connection line 166, and connected to the first gate electrode of the first transistor T1. A first electrode of the third transistor T3 may be connected to the fourth transistor T4. A second electrode of the third transistor T3 is connected to the second electrode of the first transistor T1 and electrically connected to the first electrode (e.g., the anode) of the second light-emitting diode ED2 through the sixth transistor T6. One of the first electrode and the second electrode of the third transistor T3 may be a source electrode, and the other may be a drain electrode.

The third transistor T3 is turned on according to a scan signal Sgw transferred through the scan line GW, and diode-connects the first transistor T1 by electrically connecting the first gate electrode to the second electrode of the first transistor T1.

The fourth transistor T4 may be a first initialization transistor configured to initialize the first gate electrode of the first transistor T1. A fourth gate electrode of the fourth transistor T4 is connected to an initialization gate line GI. A first electrode of the fourth transistor T4 is connected to the initialization voltage line VL. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to an initialization signal Sgi transferred through the initialization gate line GI and may perform an initialization operation of initializing the voltage of the first gate electrode of the first transistor T1 by transferring the initialization voltage Vaint to the first gate electrode of the driving transistor T1.

The fifth transistor T5 may be an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the first electrode (e.g., the anode) of the second light-emitting diode ED2. One of the first electrode and the second electrode of the sixth transistor T6 may be a source electrode, and the other may be a drain electrode.

The fifth transistor T5 and the sixth transistor T6 may be simultaneously turned on according to an emission control signal Sem transferred through the emission control line EM, the driving voltage ELVDD is transferred to the second light-emitting diode ED2, and the driving current $I_d$ flows through the second light-emitting diode ED2.

The seventh transistor T7 may be a second initialization transistor configured to initialize the first electrode (e.g., the anode) of the second light-emitting diode ED2. A seventh gate electrode of the seventh transistor T7 is connected to the initialization gate line GI. A first electrode of the seventh transistor T7 is connected to the initialization voltage line VL. A second electrode of the seventh transistor T7 is connected to the second electrode of the sixth transistor T6 and the first electrode (e.g., the anode) of the second light-emitting diode ED2. The seventh transistor T7 may be turned on according to an initialization signal Sgi transferred through the initialization gate line GI and may initialize the first electrode of the second light-emitting diode ED2 by transferring the initialization voltage Vaint to the first electrode (e.g., the anode) of the second light-emitting diode ED2.

According to some embodiments, the initialization gate line GI may be a previous scan line. As an example, the initialization gate line GI connected to the second sub-pixel circuit PC2 arranged in an i-th row (i is a natural number) may correspond to a scan line of the second sub-pixel circuit PC2 arranged in an (i−1)st row.

Figure 5:
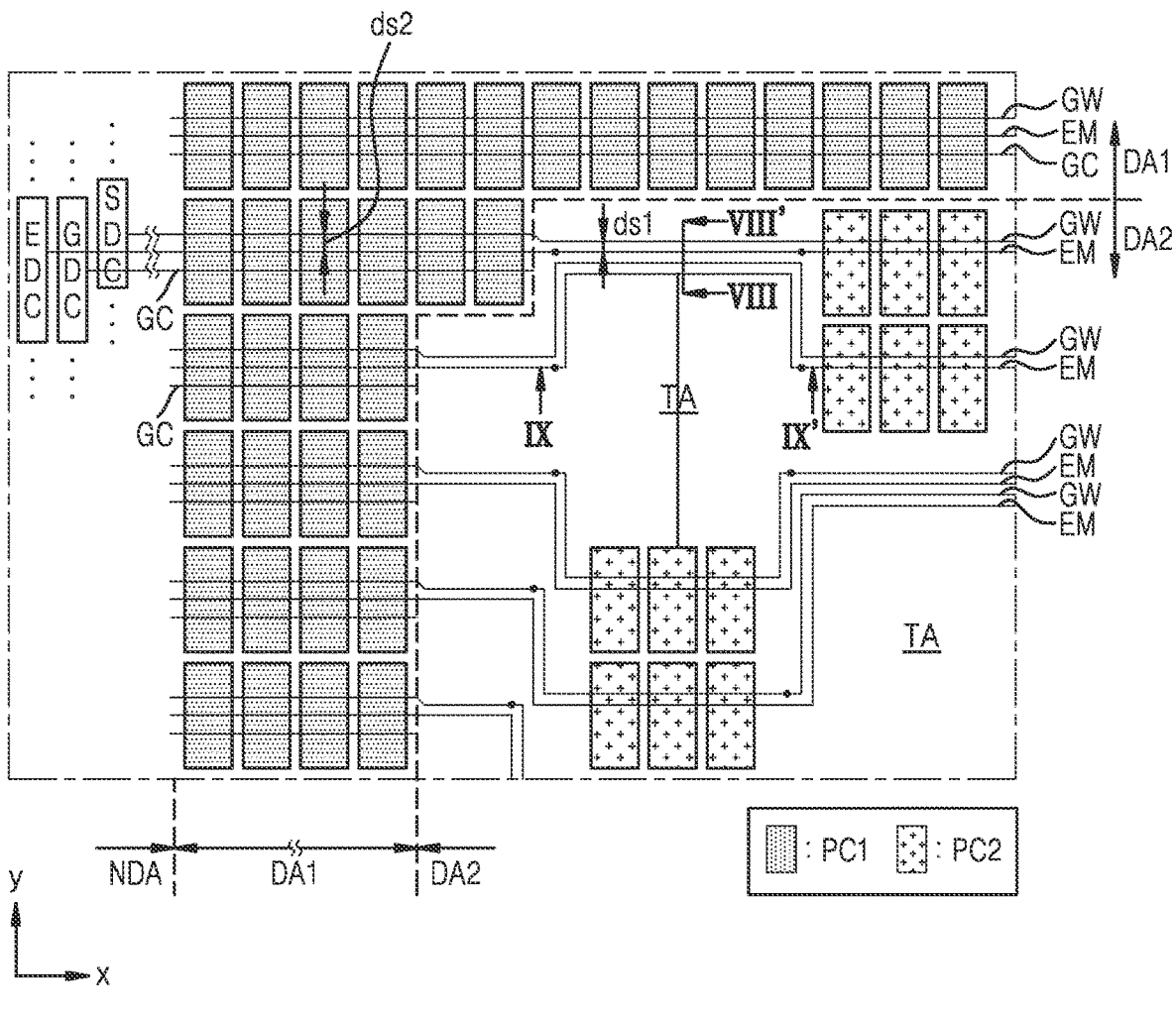
FIG. 5 is a plan view of a portion of the display panel according to some embodiments.

FIG. 5 is a plan view of a portion of the display panel 10 according to some embodiments.

Referring to FIG. 5, the first sub-pixel circuits PC1 may be arranged in the first display area DA1 in a row direction (e.g., an x direction) and a column direction (e.g., a y direction). As described above with reference to FIG. 4A, each of the first sub-pixel circuits PC1 may include the transistors including a silicon-based semiconductor material and an oxide-based semiconductor material, and capacitors.

The second sub-pixel circuit PC2 may be arranged in the second display area DA2. Unlike the first sub-pixel circuits PC1, the second sub-pixel circuits PC2 may be arranged in a group. As an example, m second sub-pixel circuits PC2 (m is a natural number) may be arranged in a group, and the transmissive area TA may be located between adjacent groups. With regard to this, it is shown in FIG. 5 that six second sub-pixel circuits PC2 form a group and are arranged in the second display area DA2, and the transmissive area TA is located between two adjacent groups each including six second sub-pixel circuits PC2. As described above with reference to FIG. 4B, each of the second sub-pixel circuits PC2 may include the transistors including a silicon-based semiconductor material and capacitors.

The first sub-pixel circuits PC1 arranged in the row direction (e.g., the x direction) may be electrically connected to a signal line extending in the row direction (e.g., the x direction). With regard to this, it is shown in FIG. 5 that the first sub-pixel circuits PC1 arranged in respective rows are electrically connected to the scan line GW, the emission control line EM, and the compensation gate line GC passing through a corresponding row.

The scan line GW, the emission control line EM, and the compensation gate line GC may be electrically connected to a plurality of drivers arranged in the non-display area NDA. Scan drivers SDC, gate drivers GDC, and emission control drivers EDC may be arranged in the non-display area NDA. Each scan line GW may be electrically connected to corresponding scan driver SDC, the compensation gate line GC may be electrically connected to a corresponding gate driver GDC, and the emission control line EM may be electrically connected to a corresponding emission control driver EDC.

As described above with reference to FIG. 4A, the third transistor T3 of the first sub-pixel circuit PC1 is electrically connected to the compensation gate line GC, but the third transistor T3 of the second sub-pixel circuit PC2 described with reference to FIG. 4B is not electrically connected to the compensation gate line GC but connected to the scan line GW. Accordingly, the compensation gate line GC passing across the first display area DA1 may not pass across the second display area DA2. As an example, one end of the compensation gate line GC may be disconnected in the neighborhood of the second display area DA2 as shown in FIG. 5.

Referring to FIGS. 3A, 3B, and 5, the compensation gate line GC passing across the first display area DA1 on the left of the second display area DA2 may be disconnected or separated from the compensation gate line GC passing across the first display area DA1 on the right of the second display area DA2. According to some embodiments, the compensation gate line GC passing across the first display area DA1 on the left of the second display area DA2 may be connected to the compensation gate line GC passing across the first display area DA1 on the right of the second display area DA2 without disconnection, but may pass across a region outside the second display area DA2.

Unlike the compensation gate line GC passing across the first display area DA1, the scan line GW and the emission control line EM passing across the first display area DA1 may pass across the second display area DA2 and be electrically connected to the second sub-pixel circuit PC2. In other words, the scan line GW and the emission control line EM extending in the row direction (e.g., the x direction) may be shared by the first sub-pixel circuits PC1 and the second sub-pixel circuits PC2.

Some of the scan lines GW and some of the emission control lines EM may pass across the upper side of the transmissive area TA, and the other scan lines GW and the other emission control lines EM may pass across the lower side of the transmissive area TA. A first interval ds1 between the signal lines passing across the upper side (or the lower side) of the transmissive area TA may be less than a second interval ds2 between the signal lines passing across the first display area DA1.

The scan line GW and the emission control line EM electrically connected to the first sub-pixel circuits PC1 arranged in one of the rows may be electrically connected to the second sub-pixel circuit PC2 in the second display area DA2, and may extend beyond one side of the transmissive area TA arranged on one side of the second display area DA2.

Referring to FIGS. 5, 4A, and 4B, the third transistor T3 of the first sub-pixel circuit PC1 may be electrically connected to the compensation gate line GC passing across the first display area DA1. The third transistor T3 of the first sub-pixel circuit PC1 may be configured to receive signals from the gate driver GDC through the compensation gate line GC passing across the first display area DA1. The third transistor T3 of the second sub-pixel circuit PC2 may be electrically connected to the scan line GW. The third transistor T3 of the second sub-pixel circuit PC2 may be configured to receive signals from the scan driver SDC through the scan line GW passing across the first and second display area DA1 and DA2.

As described above, the signal lines and the drivers connected to the first and second sub-pixel circuits PC1 and PC2 may be different from each other. Because the number of signal lines connected to the second sub-pixel circuit PC2 is less than the number of signal lines connected to the first sub-pixel circuit PC1, a space for connection of the signal lines around the transmissive area TA may be reduced, and the area of the transmissive area TA in the second display area DA2 may relatively increase.

Figure 6:
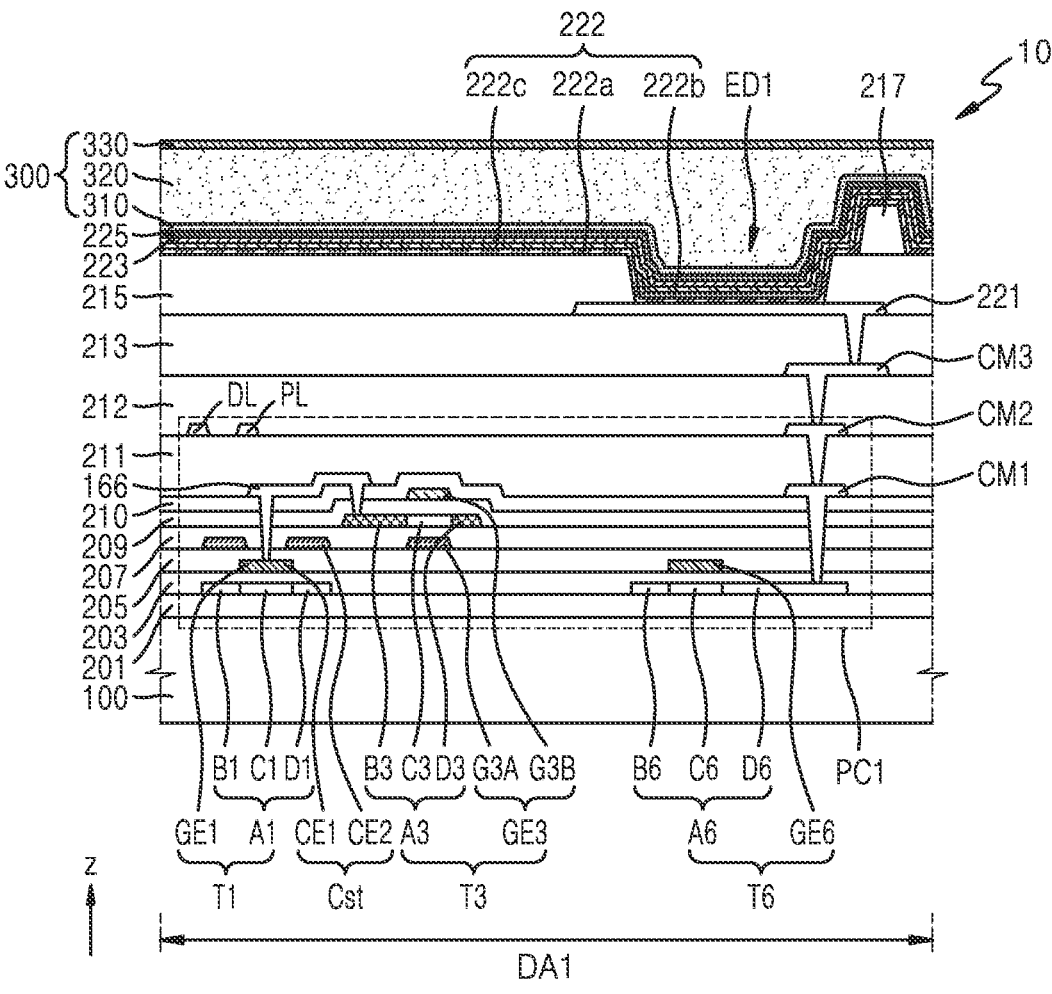
FIG. 6 is a cross-sectional view of a first sub-pixel circuit and a first light-emitting diode arranged in a first display area of a display panel according to some embodiments.

FIG. 6 is a cross-sectional view of the first sub-pixel circuit PC1 and the first light-emitting diode ED1 arranged in the first display area DA1 of the display panel 10 according to some embodiments.

Referring to FIG. 6, the first sub-pixel circuit PC1 located over the substrate 100, and the first light-emitting diode ED1 over the first sub-pixel circuit PC1 may be located in the first display area DA1. The substrate 100 may include glass or polymer resin.

A buffer layer 201 may be located on the upper surface of the substrate 100. The buffer layer 201 may prevent or reduce instances of impurities or other contaminants penetrating a semiconductor layer of a transistor. The buffer layer 201 may include an inorganic insulating material, such as silicon nitride, silicon oxynitride, and silicon oxide, and include a single layer or a multi-layer including the above inorganic insulating materials.

The first sub-pixel circuit PC1 may be located on the buffer layer 201. As described above with reference to FIG. 4, the first sub-pixel circuit PC1 may include the plurality of transistors and the storage capacitor. With regard to this, FIG. 6 shows the first transistor T1, the third transistor T3, the sixth transistor T6, and the storage capacitor Cst.

The first transistor T1 may include a first semiconductor layer A1 and a first gate electrode GE1, wherein the first semiconductor layer A1 is on the buffer layer 201, and the first gate electrode GE1 overlaps a channel region C1 of the first semiconductor layer A1. The first semiconductor layer A1 may include a silicon-based semiconductor material, for example, polycrystalline silicon. The first semiconductor layer A1 may include the channel region C1, and a first region B1 and a second region D1 respectively arranged on two opposite sides of the channel region C1. The first region B1 and the second region D1 are regions including impurities of higher concentration than the concentration of the channel region C1. One of the first region B1 and the second region D1 may correspond to a source region, and the other may correspond to a drain region.

The sixth transistor T6 may include a sixth semiconductor layer A6 and a sixth gate electrode GE6, wherein the sixth semiconductor layer A6 is on the buffer layer 201, and the sixth gate electrode GE6 overlaps a channel region C6 of the sixth semiconductor layer A6. The sixth semiconductor layer A6 may include a silicon-based semiconductor material, for example, polycrystalline silicon. The sixth semiconductor layer A6 may include the channel region C6, a first region B6, and a second region D6 respectively arranged on two opposite sides of the channel region C6. The first region B6 and the second region D6 are regions including impurities of higher concentration than the concentration of the channel region C6. One of the first region B6 and the second region D6 may correspond to a source region, and the other may correspond to a drain region.

The first gate electrode GE1 and the sixth gate electrode GE6 may include a conductive material including molybdenum (Mo), aluminum (Al), copper (Cu), and titanium (Ti) and have a single-layered structure or a multi-layered structure including the above materials. A first gate insulating layer 203 may be located below the first gate electrode GE1 and the sixth gate electrode GE6, wherein the first gate insulating layer 203 is for electrical insulation between the first semiconductor layer A1 and the first gate electrode GE1 and between the sixth semiconductor layer A6 and the sixth gate electrode GE6. The first gate insulating layer 203 may include an inorganic insulating material, such as silicon nitride, silicon oxynitride, and silicon oxide, and include a single layer or a multi-layer including the above inorganic insulating materials.

The storage capacitor Cst may include the lower electrode CE1 and the upper electrode CE2 overlapping each other. According to some embodiments, the lower electrode CE1 of the storage capacitor Cst may include the first gate electrode GE1. In other words, the first gate electrode GE1 may include the lower electrode CE1 of the storage capacitor Cst. As an example, the first gate electrode GE1 and the lower electrode CE1 of the storage capacitor Cst may be one body.

A first interlayer insulating layer 205 may be located between the lower electrode CE1 and the upper electrode CE2 of the storage capacitor Cst. The first interlayer insulating layer 205 may include an inorganic insulating material, such as silicon nitride, silicon oxynitride, and silicon oxide, and include a single-layered structure or a multi-layered structure including the above inorganic insulating materials.

The upper electrode CE2 of the storage capacitor Cst may include a conductive material of a low-resistance material, such as molybdenum (Mo), aluminum (Al), copper (Cu) and/or titanium (Ti), and have a single-layered structure or a multi-layered structure including the above materials.

A second interlayer insulating layer 207 may be located on the storage capacitor Cst. The second interlayer insulating layer 207 may include an inorganic insulating material, such as silicon nitride, silicon oxynitride, and silicon oxide, and include a single-layered structure or a multi-layered structure including the above inorganic insulating materials.

A third semiconductor layer A3 of the third transistor T3 may be located on the second interlayer insulating layer 207. The third semiconductor layer A3 may include an oxide-based semiconductor material. As an example, the third semiconductor layer A3 may include Zn-oxide-based material, for example, include Zn-oxide, In—Zn oxide, and Ga—In—Zn oxide. According to some embodiments, the third semiconductor layer A3 may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The third semiconductor layer A3 may include a channel region C3, a first region B3, and a second region D3 respectively arranged on two opposite sides of the channel region C3. One of the first region B3 and the second region D3 may correspond to a source region, and the other may correspond to a drain region.

The third transistor T3 may include a third gate electrode GE3 overlapping the channel region C3 of the third semiconductor layer A3. The third gate electrode GE3 may have a double gate structure including a lower gate electrode G3A and an upper gate electrode G3B, wherein the lower gate electrode G3A is below the third semiconductor layer A3, and the upper gate electrode G3B is over the channel region C3.

The lower gate electrode G3A may be on the same layer (e.g., the first interlayer insulating layer 205) as a layer on which the upper electrode CE2 of the storage capacitor Cst is arranged. The lower gate electrode G3A may include the same material as a material of the upper electrode CE2 of the storage capacitor Cst.

The upper gate electrode G3B may be located over the third semiconductor layer A3 with a second gate insulating layer 209 therebetween. The second gate insulating layer 209 may include an inorganic insulating material, such as silicon nitride, silicon oxynitride, and silicon oxide, and include a single-layered structure or a multi-layered structure including the above inorganic insulating materials.

A third interlayer insulating layer 210 may be located on the upper gate electrode G3B. The third interlayer insulating layer 210 may include an inorganic insulating material, such as silicon oxynitride, and have a single layer or a multi-layer including the inorganic insulating materials.

Though it is shown in FIG. 6 that the upper electrode CE2 of the storage capacitor Cst is arranged on the same layer as the lower gate electrode G3A of the third gate electrode GE3, the embodiments are not limited thereto. According to some embodiments, the upper electrode CE2 of the storage capacitor Cst may be arranged on the same layer as the third semiconductor layer A3, and may include the same material as that of the first region B3 and the second region D3 of the third semiconductor layer A3.

The first transistor T1 may be electrically connected to the third transistor T3 through the node connection line 166. The node connection line 166 may be located on the third interlayer insulating layer 210. One side of the node connection line 166 may be connected to the first gate electrode GE1 of the first transistor T1, and another side of the node connection line 166 may be connected to the first region B3 of the third semiconductor layer A3 of the third transistor T3.

The node connection line 166 may include aluminum (Al), copper (Cu), and/or titanium (Ti), and include a single layer or a multi-layer including the above materials. As an example, the node connection line 166 may have a triple-layered structure of titanium layer/aluminum layer/titanium layer.

A first organic insulating layer 211 may be located on the node connection line 166. The first organic insulating layer 211 may include an organic insulating material. The organic insulating material may include acryl, benzocyclobutene (BCB), polyimide, or hexamethyldisiloxane (HMDSO).

A first organic insulating layer 211 may be located on the node connection line 166. The first organic insulating layer 211 may include an organic insulating material. The organic insulating material may include acryl, benzocyclobutene (BCB), polyimide, or hexamethyldisiloxane (HMDSO).

The data line DL and the driving voltage line PL may be located on the first organic insulating layer 211. The data line DL and the driving voltage line PL may include aluminum (Al), copper (Cu), and/or titanium (Ti), and include a single layer or a multi-layer including the above materials. As an example, the data line DL and the driving voltage line PL may each have a triple-layered structure of titanium layer/ aluminum layer/titanium layer.

Though it is shown in FIG. 6 that the data line DL and the driving voltage line PL are located on the same layer (e.g., the first organic insulating layer 211), the data line DL and the driving voltage line PL may be located on different layers according to some embodiments. As an example, one of the data line DL and the driving voltage line PL may be located on the first organic insulating layer 211, and the other may be located on a second organic insulating layer 212.

The second organic insulating layer 212 and a third organic insulating layer 213 may be located on the first organic insulating layer 211. The second organic insulating layer 212 and the third organic insulating layer 213 may each include an organic insulating material, such as acryl, benzocyclobutene, polyimide, or hexamethyldisiloxane (HMDSO).

A first electrode 221 of the first light-emitting diode ED1 may be located on the third organic insulating layer 213. The first electrode 221 may be electrically connected to the sixth transistor T6 through first to third connection metals CM1, CM2, and CM3. The first connection metal CM1 may be formed on the same layer as the node connection line 166, and may include the same material as a material of the node connection line 166. The second connection metal CM2 may be formed on the same layer as the data line DL and/or the driving voltage line PL, and may include the same material as a material of the data line DL and/or the driving voltage line PL. The third connection metal CM3 may include a conductive material, for example, metal (e.g., metal having no light transmittance) or a conductive material having a light transmittance.

The first electrode 221 may include a reflective layer including silver (Ag), magnesium (Mg), aluminum (Al), platinum (Pt), palladium (Pd), gold (Au), nickel (Ni), neo-dymium (Nd), iridium (Ir), chrome (Cr), or a compound thereof. According to some embodiments, the first electrode 221 may further include a conductive oxide material layer on and/or under the reflective layer. The conductive oxide material layer may include indium tin oxide (ITO), indium zinc oxide (IZO), zinc oxide (ZnO), indium oxide ($In_2O_3$), indium gallium oxide (IGO), and/or aluminum zinc oxide (AZO). According to some embodiments, the first electrode

221 may include a plurality of sub-layers. As an example, the first electrode 221 may have a stack structure including an ITO layer, an Ag layer, and an ITO layer.

A bank layer 215 may be located on the first electrode 221. The bank layer 215 may include an opening that overlaps the first electrode 221 and cover the edges of the first electrode 221. The bank layer 215 may include an organic insulating material, such as polyimide.

A spacer 217 may be formed on the bank layer 215. The spacer 217 may be formed together during the same process as a process of forming the bank layer 215, or formed separately during a separate process. According to some embodiments, the spacer 217 may include an organic insulating material, such as polyimide. According to some embodiments, the bank layer 215 may include an organic insulating material including a light-blocking dye, and the spacer 217 may include an organic insulating material, such as polyimide.

An intermediate layer 222 includes an emission layer 222b. The intermediate layer 222 may include a first functional layer 222a and/or a second functional layer 222c, wherein the first functional layer 222a is under the emission layer 222b, and the second functional layer 222c is on the emission layer 222b. The emission layer 222b may include a polymer organic material or a low-molecular weight organic material emitting light having a preset color (red, green, or blue). According to some embodiments, the emission layer 222b may include an inorganic material or quantum dots.

The second functional layer 222c may include an electron transport layer (ETL) and/or an electron injection layer (EIL). The first functional layer 222a and the second functional layer 222c may each include an organic material.

The emission layer 222b may be formed in the first display area DA1 to overlap the first electrode 221 through the opening of the bank layer 215. In contrast, an organic material layer, for example, the first functional layer 222a and the second functional layer 222c included in the intermediate layer, may cover the display area DA (see FIG. 3) entirely.

The intermediate layer 222 may have a single stack structure including a single emission layer, or a tandem structure, which is a multi-stack structure including a plurality of emission layers. In the case where the intermediate layer 222 has a tandem structure, a charge generation layer CGL may be located between the plurality of stacks.

A second electrode 223 may include a conductive material having a low work function. As an example, the second electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. Alternatively, the second electrode 223 may further include a layer on the (semi) transparent layer, the layer including ITO, IZO, ZnO, or $In_2O_3$. The second electrode 223 may cover the display area DA (see FIG. 3) entirely.

A capping layer 225 may be located on the second electrode 223. The capping layer 225 may include an inorganic material or an organic material. The capping layer 225 may include lithium fluoride (LiF), an inorganic insulating material and/or an organic insulating material. The capping layer 225 may cover the display area DA entirely.

The first light-emitting diode ED1 may be covered by the encapsulation layer 300. The encapsulation layer 300 may include at least one organic encapsulation layer and at least one inorganic encapsulation layer. According to some embodiments, it is shown in FIG. 6 that the encapsulation layer 300 includes first and second inorganic encapsulation layers 310 and 330, and an organic encapsulation layer 320 therebetween. The encapsulation layer 300 may be located on the capping layer 225.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, or silicon oxynitride. The first and second inorganic encapsulation layer 310 and 330 may include a single layer or a multi-layer including the above materials. The organic encapsulation layer 320 may include a polymer-based material. The polymer-based material may include an acryl-based resin, an epoxy-based resin, polyimide, and polyethylene. According to some embodiments, the organic encapsulation layer 320 may include acrylate.

Figure 7:
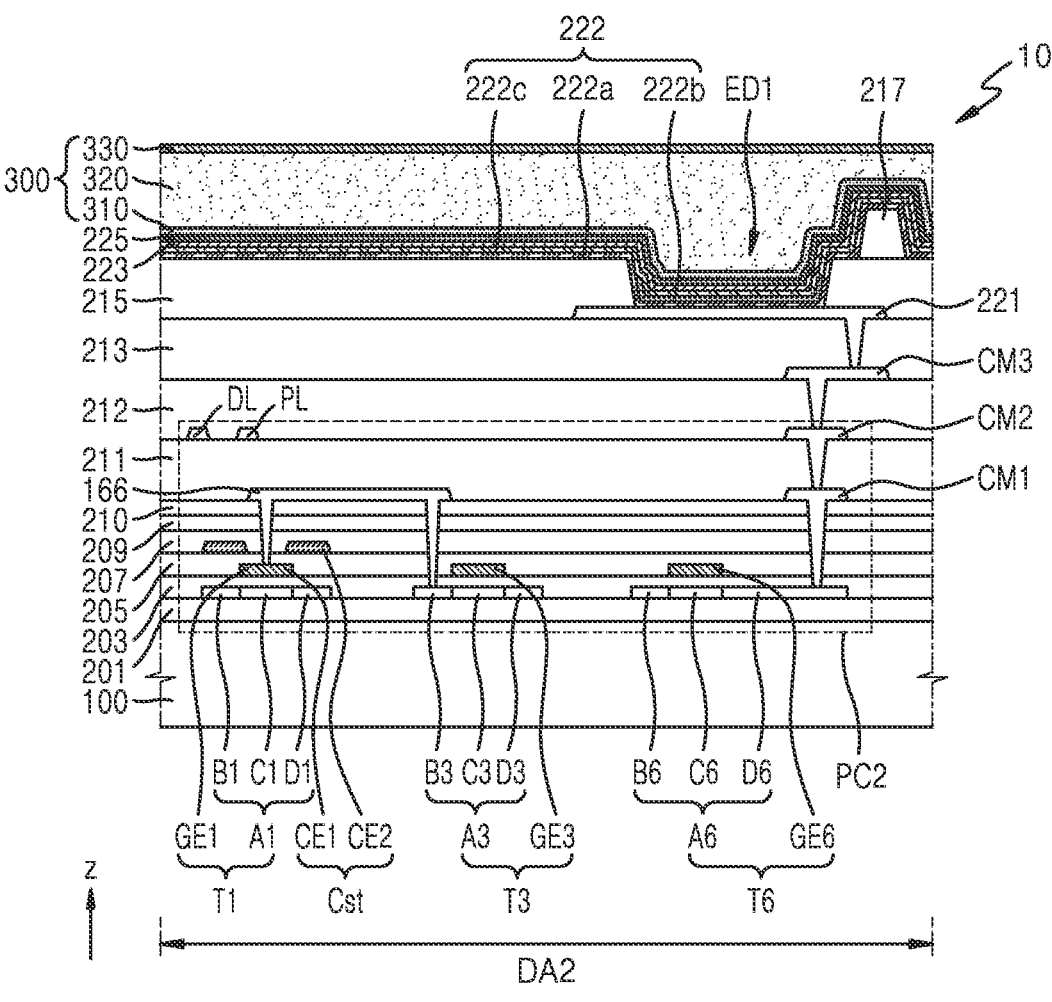
FIG. 7 is a cross-sectional view of a second sub-pixel circuit and a second light-emitting diode arranged in a second display area of a display panel according to some embodiments.

FIG. 7 is a cross-sectional view of the second sub-pixel circuit PC2 and the second light-emitting diode ED2 arranged in the second display area DA2 of the display panel 10 according to some embodiments.

Referring to FIG. 7, the second sub-pixel circuit PC2 on the substrate 100 may be arranged in the second display area DA2, and the second light-emitting diode ED2 may be located on the second sub-pixel circuit PC2. As described above with reference to FIG. 4B, the second sub-pixel circuit PC2 may include the plurality of transistors and the storage capacitor. With regard to this, FIG. 7 shows the first transistor T1, the third transistor T3, and the sixth transistor T6 of the second sub-pixel circuit PC2.

The second light-emitting diode ED2 electrically connected to the second sub-pixel circuit PC2 may include the first electrode 221, the intermediate layer 222, and the second electrode 223. The first electrode 221 of the second light-emitting diode ED2 may be electrically connected to the sixth transistor T6 of the second sub-pixel circuit PC2 through the first to third contact metals CM1, CM2, and CM3. The second light-emitting diode ED2 may be covered by the encapsulation layer 300.

The structure of the second light-emitting diode ED2 arranged in the second display area DA2 of FIG. 7, is substantially the same as the structure of the first light-emitting diode ED1 described with reference to FIG. 6, and the third transistor T3 of the second sub-pixel circuit PC2 of FIG. 7 is different from the third transistor T3 of the first sub-pixel circuit PC1. Hereinafter, for convenience of description, description of the same structure is the same as the content described above with reference to FIG. 6, and differences are mainly described.

The third semiconductor layer A3 of the third transistor T3 of the first sub-pixel circuit PC1 described with reference to FIG. 6, is located on the second interlayer insulating layer 207, while the third semiconductor layer A3 of the second sub-pixel circuit PC2 shown in FIG. 7 may be located on the same layer (e.g., the buffer layer 201) as the first semiconductor layer A1 of the first transistor T1.

Referring to FIG. 7, the third semiconductor layer A3 of the second sub-pixel circuit PC2 may include the same material as a material of the first semiconductor layer A1 of the first transistor T1. As an example, the third semiconductor layer A3 may include a silicon-based semiconductor material.

Figure 8:
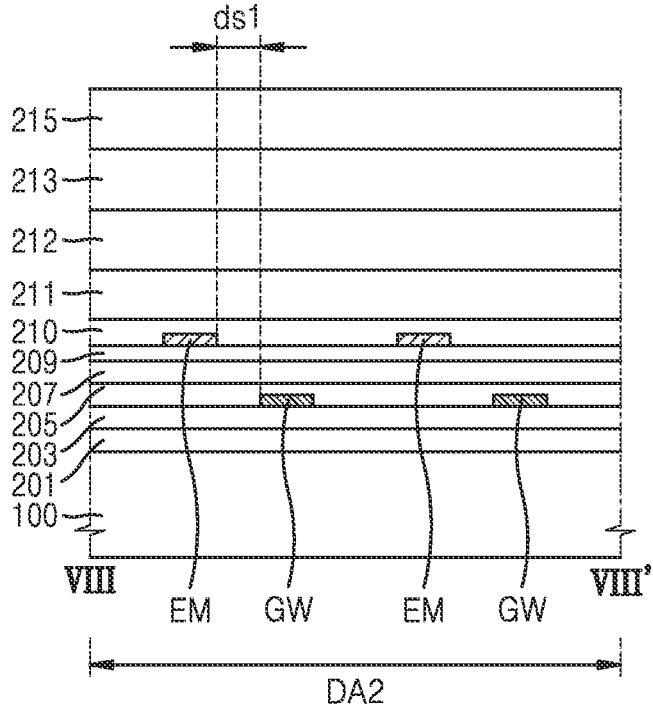
FIG. 8 is a cross-sectional view of scan lines and emission control lines passing across a second display area of a display panel according to some embodiments, taken along the line VIII-VIII' of FIG. 5.
Figure 9:
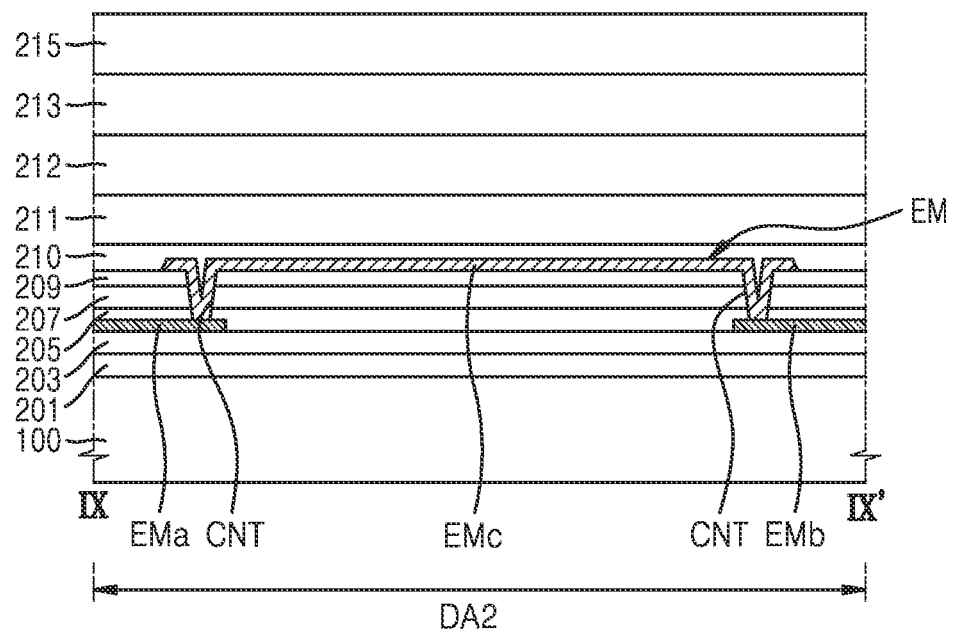
FIG. 9 is a cross-sectional view of emission control lines passing across a second display area of a display panel according to some embodiments, taken along the line IX-IX' of FIG. 5.

FIG. 8 is a cross-sectional view of scan lines and emission control lines passing across the second display area DA2 of the display panel 10 according to some embodiments, and FIG. 9 is a cross-sectional view of emission control lines passing across the second display area DA2 of the display panel 10 according to some embodiments. FIG. 8 is a cross-sectional view of scan lines and emission control lines, taken along the line VIII-VIII' of FIG. 5, and FIG. 9 is a cross-sectional view of emission control lines, taken along the line IX-IX' of FIG. 5.

Referring to FIG. 8, signal lines located on one side (e.g., the upper side) of the transmissive area TA and passing across the neighborhood of the transmissive area TA, for example, a portion of each of the scan lines GW and a portion of each of the emission control lines EM, may be located on different layers. As an example, a portion of the scan line GW located near the transmissive area TA, may be located on the first interlayer insulating layer 205, and a portion of the emission control line EM may be located on the second gate insulating layer 209.

Another portion of the scan line GW and another portion of the emission control line EM, may be located on the same layer (e.g., the first interlayer insulating layer 205) in the first display area DA1. In contrast, a portion of the scan line GW and a portion of the emission control line EM, may be located on different layers. The first interval ds1 between the scan line GW and the emission control line EM in the second display area DA2, may be formed less than the second interval ds2 (see FIG. 5) between the scan line GW and the emission control line EM in the first display area DA1.

As an example, the emission control line EM may include a first portion EMa and a second portion EMb located on the first interlayer insulating layer 205 as shown in FIG. 9. The first portion EMa may be apart from the second portion EMb in the second display area DA2. A third portion EMc of the emission control line EM may be located on a different layer from the first portion EMa and the second portion EMb, for example, on the second gate insulating layer 209. The third portion EMc of the emission control line EM may be connected to the first portion EMa and the second portion EMb through contact holes CNT passing through an insulating layer located between the first portion EMa and the second portion EMb.

As an example, a portion of the third portion EMc may directly contact the upper surface of the first portion EMa through a contact hole CNT passing through the first interlayer insulating layer 205, the second interlayer insulating layer 207, and the second gate insulating layer 209, and another portion of the third portion EMc may directly contact the upper surface of the second portion EMb through a contact hole CNT passing through the first interlayer insulating layer 205, the second interlayer insulating layer 207, and the second gate insulating layer 209. The third portion EMc of the emission control line EM may be located on the same layer as the third gate electrode, for example, the upper gate electrode G3B of the third transistor T3 of the first sub-pixel circuit PC1 (see FIGS. 5 and 6A), and may include the same material as a material of the upper gate electrode G3B.

Though it is described with reference to FIGS. 8 and 9 that the scan line GW and the emission control line EM include portions located on different layers, the embodiments are not limited thereto. According to some embodiments, the scan line GW may include a plurality of portions that are located on different layers and are connected to each other as described with reference to FIG. 9.

FIGS. 10A, 10B, 10C, 10D, and 10E are conceptual views for explaining an operation of the display panel 10 depending on a driving frequency according to some embodiments.

The display panel according to some embodiments may support a variable refresh rate (VRR). The VRR is a frequency at which a data signal is substantially written on the first transistor, which is a driving transistor of each of the sub-pixel circuits, and also called a screen scan rate, a screen reproduction rate. The VRR may represent the number of image frames reproduced for one second. According to some embodiments, the refresh rate may be an output frequency of a driver connected to the scan line and/or the data line. A frequency corresponding to the refresh rate may be a driving frequency. The display panel may be configured to adjust an output frequency of the scan driver and an output frequency of the data driver corresponding thereto according to a driving frequency. The display panel supporting the VRR may be configured to operate by changing the driving frequency within a range between a maximum driving frequency and a minimum driving frequency. As an example, in the case where the refresh rate is about 60 Hz, a gate signal for writing a data signal from the gate driver 130 may be supplied to each horizontal line (pixel row) 60 times per second.

Hereinafter, the maximum driving frequency of the display panel is referred to as a first driving frequency, and a driving frequency lower than the maximum driving frequency is referred to as a second driving frequency. The display panel may be configured to operate at the second driving frequency to reduce power consumption. As an example, in the case where an operation control signal (e.g., a signal input from a keyboard) is not input, a still image is displayed, or the display panel is driven in a standby mode for a preset time, the display panel may be configured to operate at the second frequency, and thus, be driven at low speeds.

One frame 1F may include a first period DS or include the first period DS and one or more second periods SS depending on a driving frequency. The first period DS may be defined as a display scan period in which a data signal is written on each sub-pixel circuit (e.g., the first and/or second sub-pixel circuit), and the light-emitting diodes (e.g., the first and second light-emitting diodes) emit light. The second period SS may be defined as a self-scan period in which at least one gate signal is applied but a data signal is not written on each sub-pixel circuit (e.g., the first and/or second sub-pixel circuit).

Figure 10A:
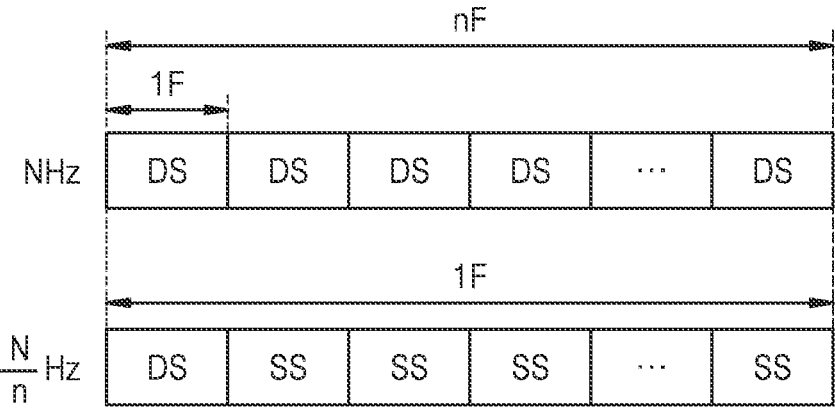
FIGS. 10A, 10B, 10C, 10D, and 10E are conceptual views for explaining an operation of a display panel depending on a driving frequency according to some embodiments.
Figure 10B:
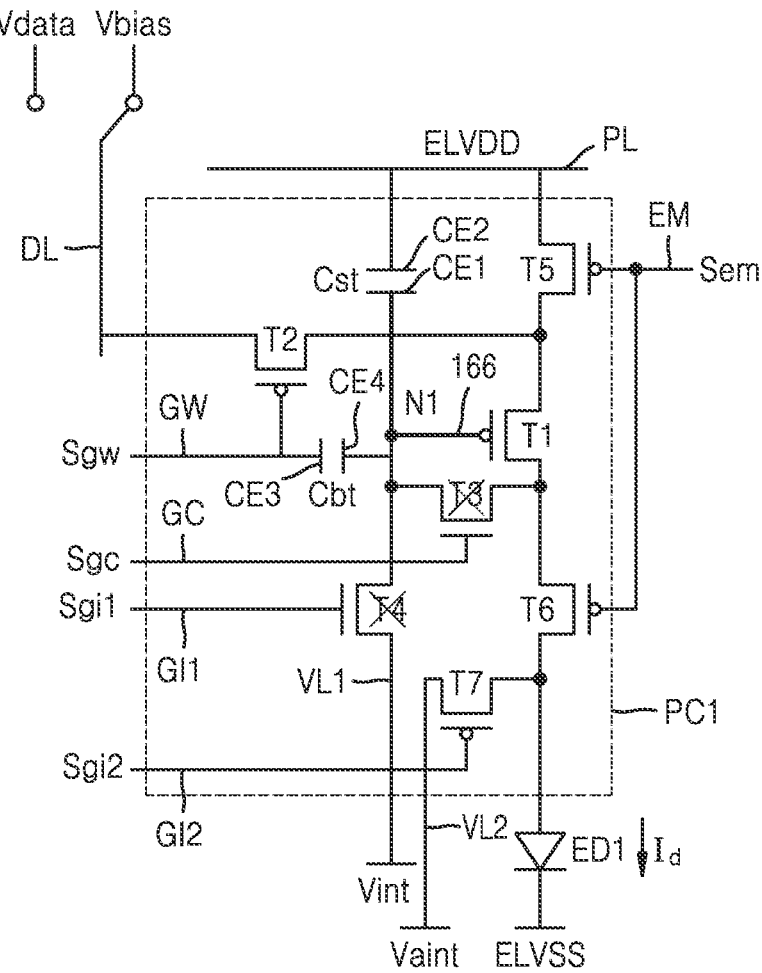

The operation of the first sub-pixel circuit may be different from the operation of the second sub-pixel circuit during the second period SS. As an example, during the second period SS, because a signal is not applied to the gate electrode of each of the third transistor T3 and the fourth transistor T4 of the first sub-pixel circuit PC1, the third transistor T3 and the fourth transistor T4 are in an off-state, a bias voltage Vbias may be applied to the second transistor T2, and the first light-emitting diode ED1 may be configured to emit light as shown in FIG. 10B. The bias voltage Vbias may be provided from the data driver electrically connected to the first sub-pixel circuit PC1.

Figure 10C:
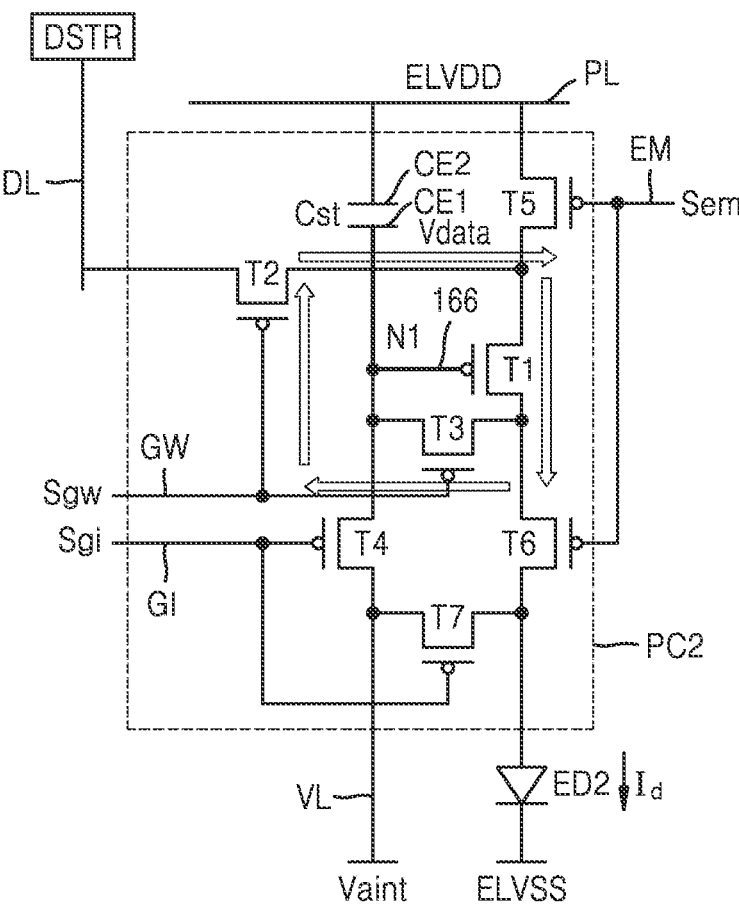

During the second period SS, a previous voltage Vdata may be applied to the second sub-pixel circuit PC2 and the second light-emitting diode ED2 may be configured to emit light as shown in FIG. 10C. To apply a previous data voltage Vdata, the data storage portion DSTR configured to store the previous data voltage Vdata, may be arranged in the non-display area NDA as described with reference to FIGS. 3A and 3B, and the previous data voltage Vdata stored in the data storage portion DSTR may be provided to the second transistor T2 of the second sub-pixel circuit PC2 during the second period SS.

Figure 10D:
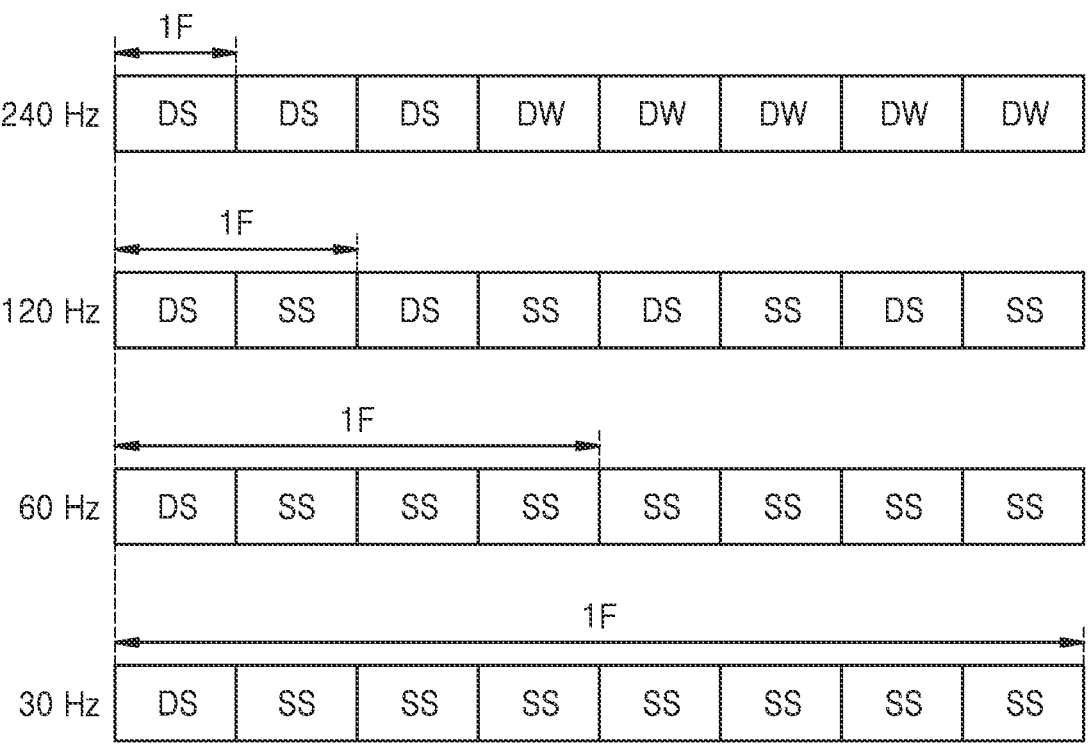
Figure 10E:
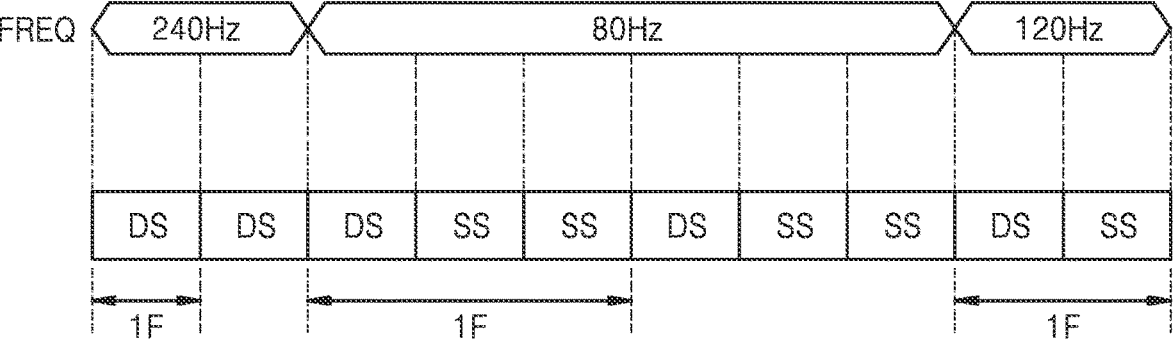

In the case where the driving frequency is the first driving frequency, one frame 1F may include one first period DS. In the case where the driving frequency is the second driving frequency, one frame 1F may include one first period DS and one or more second periods SS. Referring to FIG. 10D, in the case where the maximum driving frequency is N Hz, the second driving frequency may be N/n Hz (n≥2). In the case where the driving frequency is the second driving frequency, the length of one frame 1F may be n times the length of one frame 1F when the driving frequency is the first driving frequency. In the case where the display panel is configured to operate at the second driving frequency, one frame 1F may include one first period DS and (n–1) second periods SS. FIG. 10D shows an example in which the maximum driving frequency is about 240 Hz, and the second driving frequency is lowered to 120 Hz, 60 Hz, 30 Hz, and the like. In FIG. 10D, in the case where the second driving frequency is about 120 Hz, one frame 1F may include one first scan period DS and one second scan period SS. In the case where the first driving frequency is about 30 Hz, one frame 1F may include one first scan period DS and seven second scan periods SS. According to some embodiments, as shown in FIG. 10E, the display panel may be configured to display images while changing the driving frequency to about 240 Hz, 80 Hz, and 120 Hz depending on the refresh rate. According to some embodiments, the frequency may be variously changed, such as displaying images while the driving frequency is changed to about 120 Hz and 60 Hz.

According to some embodiments, a display panel that has relatively high quality in which the area of the transmissive area of the second display area including the transmissive area, may be sufficiently secured, and a local brightness change may be prevented or reduced when driven at low speeds, and an electronic apparatus including the display panel, are provided. However, this effect is an example, and the disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
a plurality of first light-emitting diodes in a first display area;
a plurality of first sub-pixel circuits in the first display area and electrically connected to the plurality of first light-emitting diodes;
a plurality of second light-emitting diodes in a second display area at least partially surrounded by the first display area;
a plurality of second sub-pixel circuits in the second display area and electrically connected to the plurality of second light-emitting diodes; and
a transmissive area between the plurality of second light-emitting diodes,
wherein each of the plurality of first sub-pixel circuits and the plurality of second sub-pixel circuits includes:
a first transistor;
a second transistor electrically connected to the first transistor and a data line;
a third transistor diode-connecting a gate electrode to a drain electrode of the first transistor, and
wherein a first signal line is configured to transfer a signal different from a signal of a second signal line, the first signal line being electrically connected to a gate electrode of the third transistor of each of the plurality of first sub-pixel circuits, and the second signal line being electrically connected to a gate electrode of the third transistor of each of the plurality of second sub-pixel circuits; and
a non-display area outside a display area including the first display area and the second display area; and
a plurality of scan drivers and a plurality of gate drivers each in the non-display area,
wherein the first signal line is electrically connected to one of the plurality of scan drivers, and the second signal line is electrically connected to one of the plurality of scan drivers.

2. The display panel of claim 1, further comprising a plurality of scan lines electrically connected to the plurality of first sub-pixel circuits, wherein each of the plurality of scan lines is electrically connected to the second transistor of the plurality of first sub-pixel circuits, and
one of the plurality of scan lines is the second signal line.

3. The display panel of claim 2, wherein each of the plurality of first sub-pixel circuits and the plurality of second sub-pixel circuits further includes a sixth transistor electrically connected to the first transistor, a first electrode of each of the plurality of first light-emitting diodes, and an emission control line.

4. The display panel of claim 3, wherein the second signal line and the emission control line are on one side of the transmissive area, and
a portion of the second signal line and a portion of the emission control line are on different layers.

5. The display panel of claim 3, wherein the second signal line and the emission control line are on one side of the transmissive area, and
the emission control line includes:
a first portion and a second portion on a same layer as the second signal line, the first portion and the second portion being spaced apart from each other; and
a third portion having two opposite ends respectively contacting the first portion and the second portion through contact holes of at least one insulating layer on the first portion and the second portion.

6. The display panel of claim 5, wherein the third portion of the emission control line includes a same material as a material of a gate electrode of the third transistor of each of the first sub-pixel circuits.

7. The display panel of claim 1, wherein the third transistor of each of the plurality of first sub-pixel circuits includes a semiconductor layer of an oxide-based semiconductor material, and
the third transistor of each of the plurality of second sub-pixel circuits includes a semiconductor layer of a silicon-based semiconductor material.

8. A display panel comprising:
a plurality of first light-emitting diodes in a first display area;
a plurality of first sub-pixel circuits in the first display area and electrically connected to the plurality of first light-emitting diodes;
a plurality of second light-emitting diodes in a second display area at least partially surrounded by the first display area;
a plurality of second sub-pixel circuits in the second display area and electrically connected to the plurality of second light-emitting diodes; and
a transmissive area between the plurality of second light-emitting diodes, wherein each of the plurality of first sub-pixel circuits and the plurality of second sub-pixel circuits includes:

a first transistor;

a second transistor electrically connected to the first transistor and a data line;

a third transistor diode-connecting a gate electrode to a drain electrode of the first transistor, and wherein a first signal line is configured to transfer a signal different from a signal of a second signal line, the first signal line being electrically connected to a gate electrode of the third transistor of each of the plurality of first sub-pixel circuits, and the second signal line being electrically connected to a gate electrode of the third transistor of each of the plurality of second sub-pixel circuits;

a non-display area outside a display area including the first display area and the second display area; and a data storage portion in the non-display area and electrically connected to a data line of each of the plurality of second sub-pixel circuits.

9. An electronic apparatus comprising:

a display panel including a display area and a non-display area, the display area including a first display area and a second display area at least partially surrounded by the first display area, and the non-display area being outside the display area; and a component below the second display area of the display panel, wherein the display panel includes:

a plurality of first light-emitting diodes in the first display area;

a plurality of first sub-pixel circuits in the first display area and electrically connected to the plurality of first light-emitting diodes;

a plurality of second light-emitting diodes in the second display area;

a plurality of second sub-pixel circuits in the second display area and electrically connected to the plurality of second light-emitting diodes; and a transmissive area between the plurality of second light-emitting diodes, wherein each of the plurality of first sub-pixel circuits and the plurality of second sub-pixel circuits includes:

a first transistor;

a second transistor electrically connected to the first transistor and a data line;

a third transistor diode-connecting a gate electrode to a drain electrode of the first transistor, and wherein a first signal line is configured to transfer a signal different from a signal of a second signal line, the first signal line being electrically connected to a gate of the third transistor of each of the plurality of first sub-pixel circuits, and the second signal line being electrically connected to a gate of the third transistor of each of the plurality of second sub-pixel circuits; and a plurality of scan drivers and a plurality of gate drivers each in the non-display area, wherein the first signal line is electrically connected to one of the plurality of gate drivers, and the second signal line is electrically connected to one of the plurality of scan drivers.

10. The electronic apparatus of claim 9, wherein the display panel further includes a plurality of scan lines electrically connected to the plurality of first sub-pixel circuits, wherein each of the plurality of scan lines is electrically connected to the second transistor of the plurality of first sub-pixel circuits, and one of the plurality of scan lines is the second signal line.

11. The electronic apparatus of claim 10, wherein each of the plurality of first sub-pixel circuits and the plurality of second sub-pixel circuits further includes a sixth transistor electrically connected to the first transistor, a first electrode of each of the plurality of first light-emitting diodes, and an emission control line.

12. The electronic apparatus of claim 11, wherein the second signal line and the emission control line are on one side of the transmissive area, and a portion of the second signal line and a portion of the emission control line are on different layers.

13. The electronic apparatus of claim 11, wherein the second signal line and the emission control line are on one side of the transmissive area, and the emission control line includes:

a first portion and a second portion on a same layer as the second signal line, the first portion and the second portion being spaced apart from each other; and a third portion having two opposite ends respectively contacting the first portion and the second portion through contact holes of at least one insulating layer on the first portion and the second portion.

14. The electronic apparatus of claim 13, wherein the third portion of the emission control line includes a same material as a material of a gate electrode of the third transistor of each of the first sub-pixel circuits.

15. The electronic apparatus of claim 13, wherein a first interval between the emission control line and the second signal line near the transmissive area is less than a second interval between the emission control line and the second signal line in the first display area.

16. The electronic apparatus of claim 9, further comprising a data storage portion in the non-display area and electrically connected to a data line of each of the plurality of second sub-pixel circuits, wherein a data line of each of the plurality of first sub-pixel circuits is not electrically connected to the data storage portion.

17. The electronic apparatus of claim 9, wherein the third transistor of each of the plurality of first sub-pixel circuits includes a semiconductor layer of an oxide-based semiconductor material, and the third transistor of each of the plurality of second sub-pixel circuits includes a semiconductor layer of a silicon-based semiconductor material.

18. The electronic apparatus of claim 9, wherein the component includes a camera or a sensor.

* * * * *